US008513793B2

(12) United States Patent
Han

(10) Patent No.: US 8,513,793 B2
(45) Date of Patent: Aug. 20, 2013

(54) STACKED SEMICONDUCTOR PACKAGE AND METHOD OF FABRICATING THE SAME

(75) Inventor: Won-Gil Han, Asan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 74 days.

(21) Appl. No.: 13/182,468

(22) Filed: Jul. 14, 2011

(65) Prior Publication Data

US 2012/0013026 A1   Jan. 19, 2012

(30) Foreign Application Priority Data

Jul. 16, 2010   (KR) .................. 10-2010-0069117

(51) Int. Cl.
*H01L 23/48* (2006.01)
(52) U.S. Cl.
USPC .................................. 257/686; 257/E25.027
(58) Field of Classification Search
USPC .......................................... 257/686, E25.027
See application file for complete search history.

(56) References Cited

U.S. PATENT DOCUMENTS

| | | | |
|---|---|---|---|
| 6,727,163 B2 | 4/2004 | Kim et al. | |
| 6,979,593 B2 | 12/2005 | Kawakami | |
| 7,129,118 B2 | 10/2006 | Yoo et al. | |
| 7,705,468 B2 * | 4/2010 | Joh | 257/777 |
| 7,781,878 B2 * | 8/2010 | Chen et al. | 257/686 |
| 7,838,979 B2 * | 11/2010 | Oh | 257/686 |
| 8,101,433 B2 * | 1/2012 | Akiba et al. | 438/15 |
| 8,232,631 B2 * | 7/2012 | Cho | 257/686 |
| 2006/0091518 A1 * | 5/2006 | Grafe et al. | 257/686 |
| 2008/0303131 A1 * | 12/2008 | McElrea et al. | 257/686 |
| 2009/0096111 A1 * | 4/2009 | Fujiwara et al. | 257/777 |
| 2009/0108470 A1 * | 4/2009 | Okada et al. | 257/777 |
| 2009/0273096 A1 * | 11/2009 | Hiew et al. | 257/777 |
| 2010/0314740 A1 * | 12/2010 | Choi et al. | 257/686 |
| 2012/0007227 A1 * | 1/2012 | Cho et al. | 257/686 |

FOREIGN PATENT DOCUMENTS

| | | |
|---|---|---|
| JP | 2003-298035 A | 10/2003 |
| JP | 2003-303921 A | 10/2003 |
| JP | 2004-207719 A | 7/2004 |
| KR | 10-2003-0070361 A | 8/2003 |
| KR | 10-2003-0081014 A | 10/2003 |
| KR | 10-2004-0056122 A | 6/2004 |

* cited by examiner

*Primary Examiner* — William D Coleman
(74) *Attorney, Agent, or Firm* — Lee & Morse, P.C.

(57) ABSTRACT

A stacked semiconductor package and an electronic system, the stacked semiconductor package including a plurality of semiconductor chips, a set of the semiconductor chips being stacked such that an extension region of a top surface of each semiconductor chip of the set extends beyond an end of a semiconductor chip stacked thereon to form a plurality of extension regions; and a plurality of protection layers on the extension regions and on an uppermost semiconductor chip of the plurality of semiconductor chips.

20 Claims, 17 Drawing Sheets

STACKED SEMICONDUCTOR PACKAGE AND METHOD OF FABRICATING THE SAME

CROSS-REFERENCE TO RELATED APPLICATION

This application claims priority under 35 U.S.C. §119 to Korean Patent Application No. 10-2010-0069117 filed on Jul. 16, 2010, the disclosure of which is hereby incorporated by reference in their entirety.

BACKGROUND

1. Field

Embodiments relate to a stacked semiconductor package and a method of fabricating the same.

2. Description of the Related Art

A semiconductor package is an electronic device in which a plurality of semiconductor chips are electrically connected to each other. Rapid developments in the digital industry have increased demand for technology capable of stacking a greater number semiconductor chips in a semiconductor package with the same volume. Also, in stacking the greater number of semiconductor chips in the semiconductor package, technology capable of enhancing intensity of each semiconductor chip is desired.

SUMMARY

Embodiments are directed to a stacked semiconductor package and a method of fabricating the same.

The embodiments may be realized by providing a stacked semiconductor package including a plurality of semiconductor chips, a set of the semiconductor chips being stacked such that an extension region of a top surface of each semiconductor chip of the set extends beyond an end of a semiconductor chip stacked thereon to form a plurality of extension regions; and a plurality of protection layers on the extension regions and on an uppermost semiconductor chip of the plurality of semiconductor chips.

The plurality of protection layers may be formed of a thermoset polymer, the thermoset polymer including a photosensitive component.

The thermoset polymer may include at least one of an epoxy, a polyimide, a novolak phenol, and a polynorbonene.

Each of the semiconductor chips of the set may include a chip pad on the extension region thereof, and each of the plurality of protection layers may include holes overlying corresponding chips pads.

The plurality of semiconductor chips may be stacked in a step structure.

The plurality of semiconductor chips may be stacked in a zigzag structure.

Each of the plurality of semiconductor chips may have a width different from others of the plurality of semiconductor chips.

Each of the semiconductor chips under another of the semiconductor chips may have a width greater than the other semiconductor chip thereon.

The plurality of semiconductor chips may be stacked in a pyramid structure.

The embodiments may also be realized by providing a stacked semiconductor package including an interconnection substrate; a plurality of semiconductor chips, a set of the semiconductor chips being stacked such that an extension region of a top surface of each semiconductor chip of the set extends beyond an end of a semiconductor chip stacked thereon to form a plurality of extension regions; a plurality of adhesive layers between the interconnection substrate and a lowermost semiconductor chip of the plurality of semiconductor chips and between each of the plurality of semiconductor chips; and a plurality of protection layers on a top surface of an uppermost semiconductor chip of the plurality of semiconductor chips and on the extension regions, the plurality of protection layers being disposed only on a region in which two semiconductor chips stacked adjacent to each other do not overlap.

The plurality of protection layers may include a plurality of first protection layers on the extension regions of the set of semiconductor chips and a second protection layer on the top surface of the uppermost semiconductor chip of the plurality of semiconductor chips.

The stacked semiconductor package may further include a substrate pad on a top surface of the interconnection substrate, the top surface being beyond an end of the plurality of semiconductor chips; and chip pads on the plurality of semiconductor chips, wherein the substrate pad is electrically connected to the chip pads by bonding wires.

The chip pads may be on the extension regions.

The second protection layer may include a hole overlying the chip pad of an uppermost semiconductor chip of the plurality of semiconductor chips, and the first protection layer may cover the chip pads on the extension regions.

The plurality of first protection layers may be formed of a different material from the second protection layer.

The second protection layer may include a protection tape such as UV tape.

The plurality of adhesive layers may be formed of a die attach film (DAF), and the plurality of protection layers may be formed of photosensitive polyimide (PSPI).

The expansion region exposed by a semiconductor chip stacked thereon.

The embodiments may also be realized by providing a stacked semiconductor package including an interconnection substrate; a plurality of semiconductor chips stacked on the interconnection substrate; a plurality of adhesive layers between the interconnection substrate and a lowermost semiconductor chip of the plurality of semiconductor chips and between each of the plurality of semiconductor chips; and a plurality of protection layers being disposed only on a region in which two semiconductor chips stacked adjacent to each other do not overlap.

The plurality of adhesive layers may include a first protection layers between the interconnection substrate and a lowermost semiconductor chip of the plurality of semiconductor chips; and a plurality of second protection layer between each of the plurality of semiconductor chips, wherein the first adhesive layer has a thickness thinner than the thickness of the plurality of second adhesive layers.

BRIEF DESCRIPTION OF THE DRAWINGS

The embodiments will become more apparent to those of ordinary skill in the art by describing in detail exemplary embodiments with reference to the attached drawings, in which.

DETAILED DESCRIPTION

Figure 1:
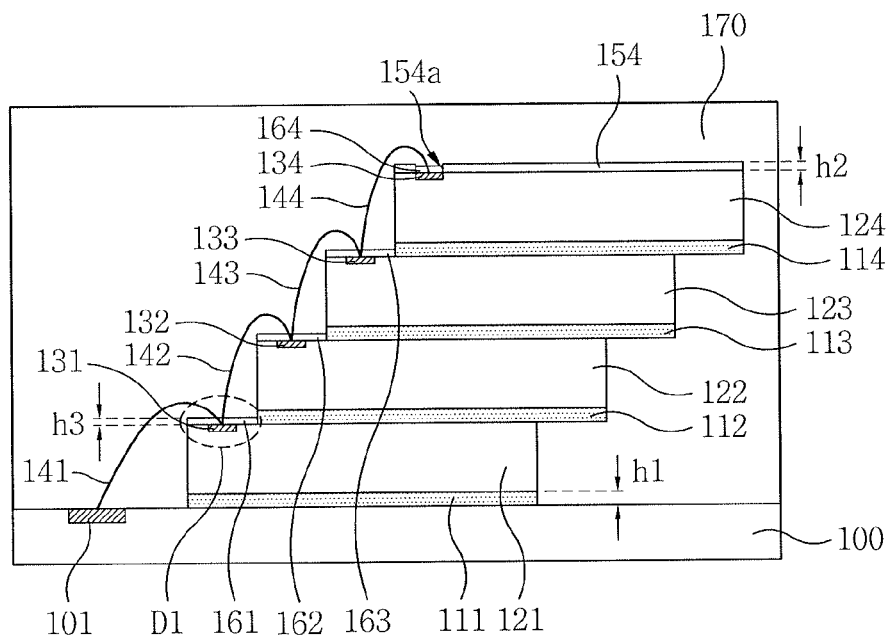
FIG. 1 illustrates a cross-sectional view of a semiconductor package according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a cross-sectional view of a semiconductor package according to an embodiment.

Referring to FIG. 1, a semiconductor package according to the present embodiment may include a first interconnection substrate 100, a plurality of semiconductor chips 121 to 124 (stacked on the interconnection substrate 100 in a step form or structure such that extension regions D1 on top surfaces thereof are exposed by the semiconductor chip stacked thereon, e.g., the extension regions D1 extend beyond an end of the semiconductor chip stacked thereon), a plurality of protection layers 154 and 161 to 164 (on the extension regions of the plurality of semiconductor chips 121 to 124 and a top surface of an uppermost of the plurality of semiconductor chips 121 to 124), and a molding layer 170 (covering side and top surfaces of the plurality of semiconductor chips 121 to 124).

The plurality of semiconductor chips 121 to 124, moving away from the interconnection substrate 100, may be sequentially referred to as a first semiconductor chip 121, a second semiconductor chip 122, a third semiconductor chip 123, and a fourth semiconductor chip 124.

In FIG. 1, four semiconductor chips 121 to 124 are stacked on the interconnection substrate 100. However, the embodiments are not limited thereto; and, e.g., in an implementation, five or more, semiconductor chips 121 to 124 may be stacked on the interconnection substrate 100.

The interconnection substrate 100 may be formed of, e.g., a printed circuit board (PCB), a lead frame (LF), a tape interconnection, a ceramic substrate, and/or a combination thereof. In an implementation, the PCB may be formed of one of, e.g., a rigid PCB, a flexible PCB, and a rigid flexible PCB.

The interconnection substrate 100 may be electrically connected to the plurality of semiconductor chips 121 to 124. For example, a substrate pad 101 may be formed on the interconnection substrate 100. The substrate pad 101 (that is an electrical circuit (not shown) on the interconnection substrate 100) may be a terminal for inputting or outputting an electrical signal. Therefore, the substrate pad 101 may be formed of a conductive material. In an implementation, the substrate pad 101 may be formed of a metal including, e.g., gold (Au), silver (Ag), copper (Cu), nickel (Ni), aluminum (Al), tin (Sn), lead (Pb), platinum (Pt), bismuth (Bi), indium (In), and/or a combination thereof.

A top surface of the substrate pad 101 may be exposed by the semiconductor chips 121 to 124, e.g., the semiconductor chips 121 to 124 may not overlie the substrate pad 101. For example, the substrate pad 101 may be formed at or near an edge of the interconnection substrate 100.

In FIG. 1, it is illustrated that one substrate pad 101 is formed on the interconnection substrate 100. However, the embodiments are not limited thereto; and a plurality of substrate pads 101 may be formed on the interconnection substrate 100.

The semiconductor chips 121 to 124 may include, e.g., a DRAM chip, a flash memory chip, a phase change memory chip, a magnetic random access memory (MRAM) chip, a resistive memory chip, and/or a combination thereof.

The plurality of semiconductor chips 121 to 124 may be stacked in a step form or structure. Accordingly, the extension regions D1 of top surfaces of the semiconductor chips 121 to 123 at lower portions of the stack may be exposed by the semiconductor chips 122 to 124 at upper portions of the stack. For example, the extension region D1 of each of the semiconductor chips may extend beyond an end of the semiconductor chip stacked thereon.

The plurality of semiconductor chips 121 to 124 may include chip pads 131 to 134 on the extension regions D1, respectively. For example, the chip pads 131 to 134 may include a first chip pad 131 on the first semiconductor chip 121, a second chip pad 132 on the second semiconductor chip 122, a third chip pad 133 on the third semiconductor chip 123, and a forth chip pad 134 on the forth semiconductor chip 124.

The chip pads 131 to 134 may be formed of a conductive material similar to the substrate pad 101. For example, the chip pads 131 to 134 may be formed of a metal including at least one of Au, Ag, Cu, Ni, Al, Sn, Pb, Pt, Bi, In, and alloys thereof.

The chip pads 131 to 134 may be electrically connected to the substrate pad 101 via bonding wires 141 to 144. For example, the bonding wires 141 to 144 may include a first bonding wire 141, a second bonding wire 142, a third bonding wire 143, and a fourth bonding wire 144 (depending on the chip pad 131 to 134 connected thereto).

In FIG. 1, it is illustrated that a part or the whole of the chip pads 131 to 134 are buried in top surfaces of the plurality of semiconductor chips 121 to 124. However, the embodiments are not limited thereto; and a part or the whole of the chip pads 131 to 134 may protrude from each top surface of the plurality of semiconductor chips 121 to 124.

Damage to protection layers 154 and 161 to 164 by external alpha particles or an alpha ray may be prevented. The protection layers 154 and 161 to 164 may include first protection layers 161 to 164 and a second protection layer 154. For example, the first protection layers 161 to 164 may be formed on respective extension regions D1 of the plurality of semiconductor chips 121 to 124. The second protection layer 154 may be formed on a top surface of the fourth semiconductor chip 124, e.g., the uppermost semiconductor chip 124 of the plurality of semiconductor chips 121 to 124.

The first protection layers 161 to 164 may include an adhesive material. For example, the first protection layers 161 to 164 may be formed of an adhesive material in a liquid phase. The first protection layers 161 to 164 may cover the chip pads 131 to 134.

The second protection layer 154 may include a photosensitive polymer. The second protection layer 154 may prevent the top surface of the semiconductor chip and/or the chip pad from being physically or chemically damaged by, e.g., a polishing process and a mounting process before the plurality of semiconductor chips 121 to 124 are mounted on the interconnection substrate 100. The second protection layer 154 may include a hole 154a overlying the fourth chip pad 134.

The photosensitive polymer may be, e.g., a thermoset polymer including a photosensitive component such as photosensitive polyimide. The thermoset polymer may be formed of, e.g., an epoxy, a polyimide, a novolak phenol, a polynorbonene, and/or a combination thereof.

The semiconductor package according to the present embodiment may further include a plurality of adhesive layers 111 to 114 between the semiconductor chips 121 to 124 and between the interconnection substrate 100 and the first semiconductor chip 121.

In an implementation, the adhesive layers 111 to 114 may include a first adhesive layer 111 at a lower portion of the first semiconductor chip 121, a second adhesive layer 112 at a lower portion of the second semiconductor chip 122, a third adhesive layer 113 at a lower portion of the third semiconductor chip 123, and a fourth adhesive layer 114 at a lower portion of the fourth semiconductor chip 124.

The adhesive layers 111 to 114 may be, e.g., a die attach film (DAF). The DAF may be formed using, e.g., a liquid-phase or film-type epoxy resin.

In FIG. 1, it is illustrated that the adhesive layers 111 to 114 are on entire lower surfaces of the plurality of semiconductor chips 121 to 124, respectively. However, the embodiments are not limited thereto; and the adhesive layers 112 to 114 may be formed only on regions of the second semiconductor chip 122 to the fourth semiconductor chip 124 in contact with the semiconductor chip thereunder. For example, in the semiconductor package according to the present embodiment, bottom surfaces of the second semiconductor chip 122 to the fourth semiconductor chip 124 may be partially exposed.

Figure 2A:
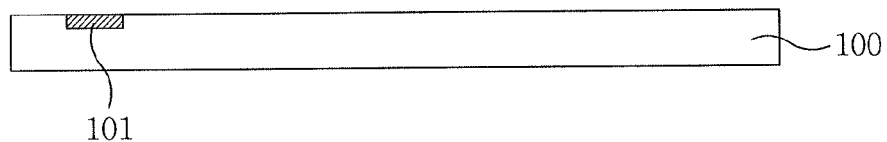
FIGS. 2A to 2I illustrate cross-sectional views of stages in a method of fabricating the semiconductor package of FIG. 1.

FIGS. 2A to 2I illustrate cross-sectional views of stages in a method of fabricating the semiconductor package of FIG. 1. FIG. 3 illustrates a process flowchart of the method of fabricating the semiconductor package of FIGS. 2A to 2I.

A method of fabricating the semiconductor package according to an embodiment will be described below with reference to FIGS. 1, 2A-2I, and 3. First, as illustrated in FIG. 2A, the method of fabricating a semiconductor package according to the present embodiment may include a process of preparing a interconnection substrate 100 including a substrate pad 101 (S1). The interconnection substrate 100 may be formed of, e.g., a PCB, an LF, a tape interconnection, a ceramic substrate, and/or a combination thereof.

Figure 2B:
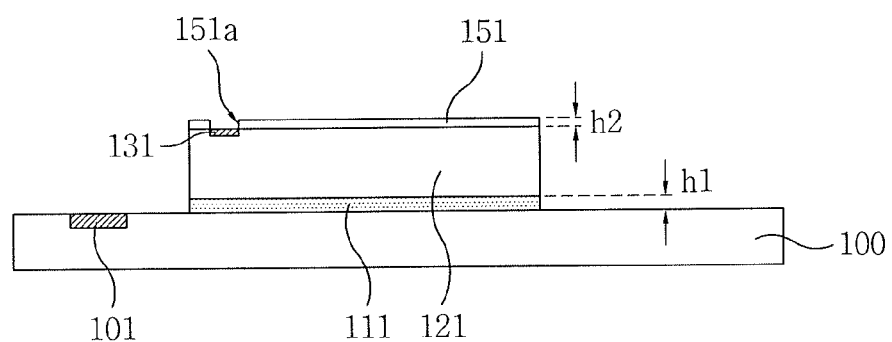
Figure 3:
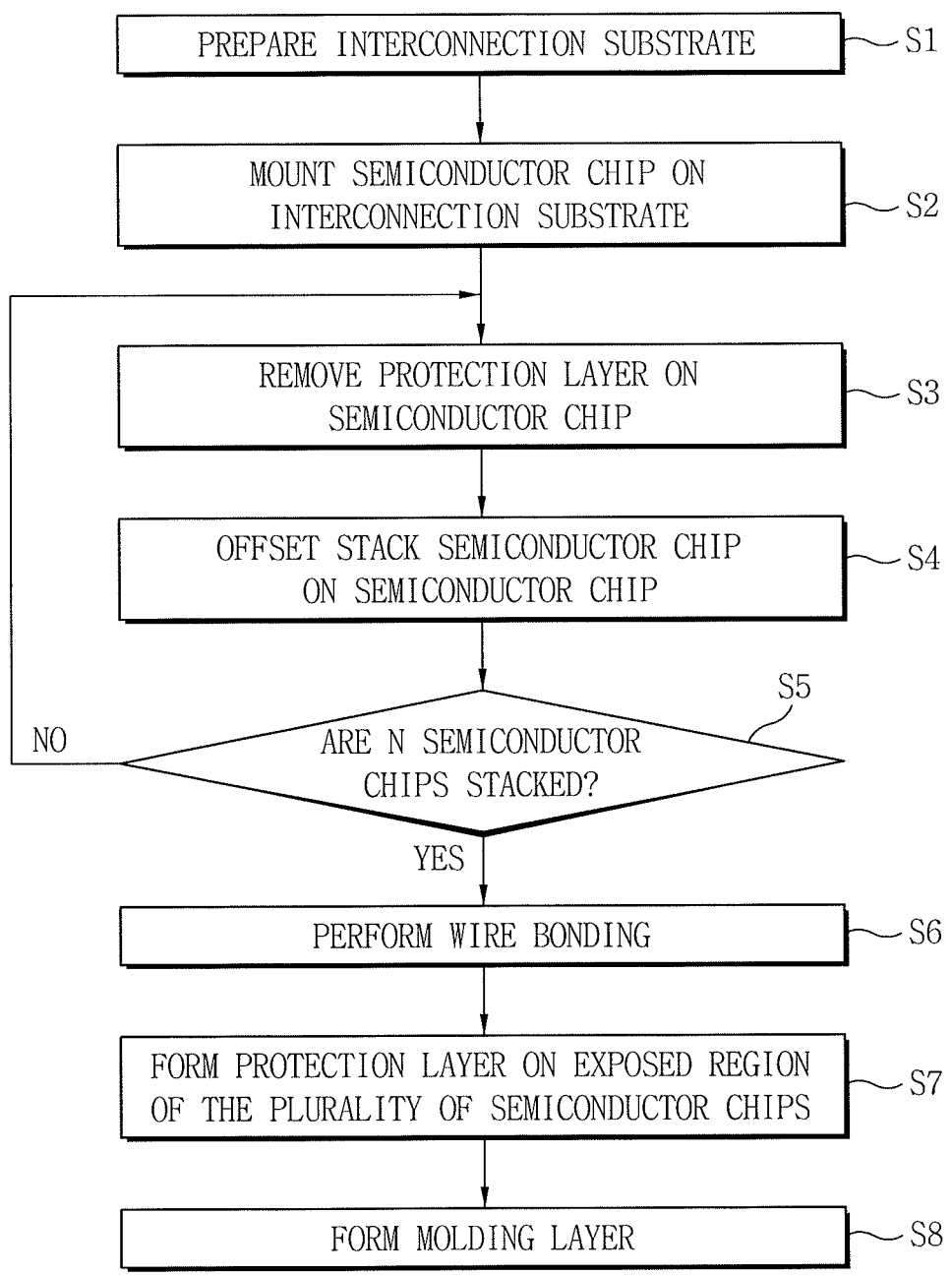
FIG. 3 illustrates a process flowchart of the method of fabricating the semiconductor package of FIGS. 2A to 2I.

Then, as illustrated in FIG. 2B, a first semiconductor chip 121 may be mounted on the interconnection substrate 100 (S2). In an implementation, the first semiconductor chip 121 may be mounted such that a top surface of the substrate pad 101 is exposed.

A first adhesive layer 111 may be formed between the interconnection substrate 100 and the first semiconductor chip 121. For example, after the first adhesive layer 111 is formed on a bottom surface of the first semiconductor chip 121, the first semiconductor chip 121 may be mounted on the interconnection substrate 100. In an implementation, after the first adhesive layer 111 is formed on the interconnection substrate 100, the first semiconductor chip 121 may be mounted thereon.

The first adhesive layer 111 may be a DAF. The DAF may be formed using an epoxy resin in a liquid or film form.

The first adhesive layer 111 may be formed to a first thickness h1 such that the first semiconductor chip 121 may be sufficiently bonded on the interconnection substrate 100. The first thickness h1 may be, e.g., about 10 μm to about 20 μm.

The first semiconductor chip 121 may include a first chip pad 131 on an extension region D1 of the top surface of the first semiconductor chip 121. The extension region D1 may be a region exposed after stacking of a second semiconductor chip 122 in a subsequent process. For example, the extension region D1 of the first semiconductor chip 121 may extend beyond an end of the second semiconductor chip 122 stacked thereon. The first chip pad 131 may be at a position closest or adjacent to the substrate pad 101 on the top surface of the first semiconductor chip 121. Accordingly, an electrical connection between the first chip pad 131 and the substrate pad 101 may be facilitated.

The first semiconductor chip 121 may include a first aid protection layer 151 covering the top surface thereof. The first aid protection layer 151 may prevent the first semiconductor chip 121 from being damaged during polishing and mounting processes. The first aid protection layer 151 may be formed to a second thickness h2. The second thickness h2 may be, e.g., about 5 μm to about 7 μm. The first aid protection layer 151 may be formed of a photosensitive polymer, e.g., photosensitive polyimide (PSPI), or a protection tape, e.g., a UV tape. The first aid protection layer 151 may include a hole 151a partially or entirely exposing the first chip pad 131. The hole 151a may be used during testing of the first semiconductor chip 121.

Figure 2C:
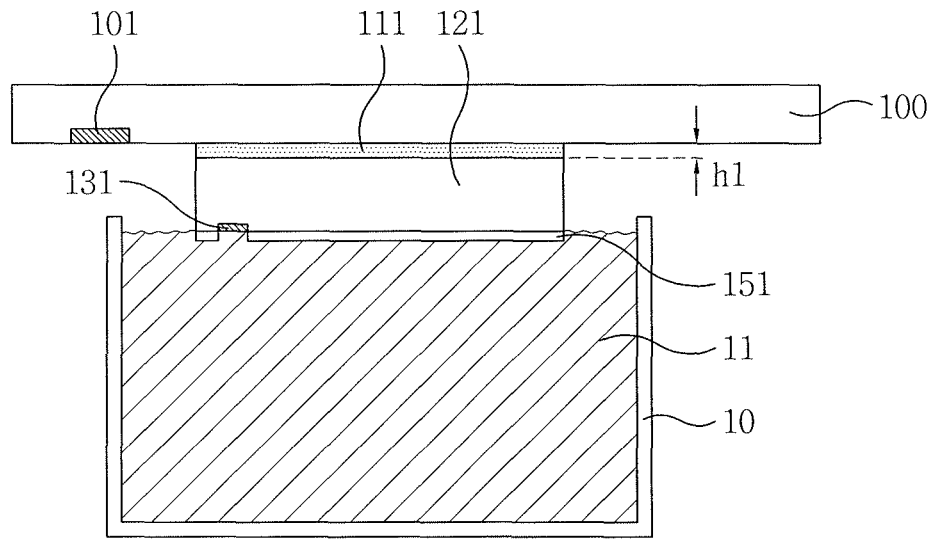
Figure 2D:
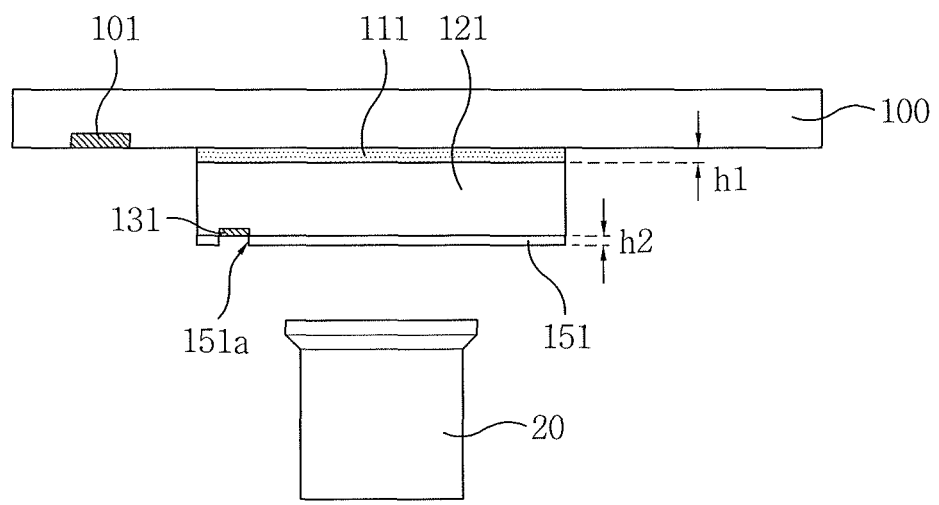
Figure 2E:
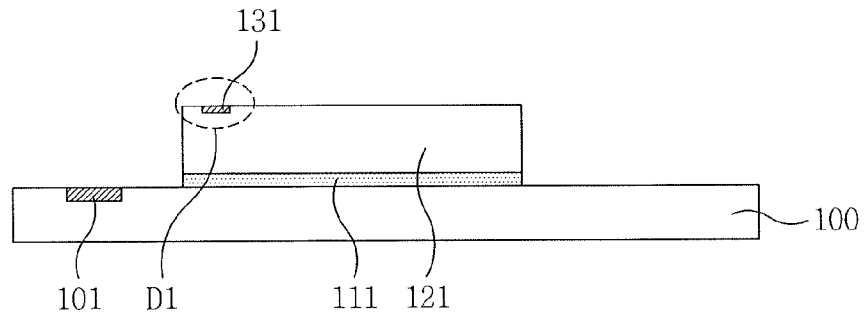

Next, as illustrated in FIGS. 2C to 2E, the method may include a process of removing the first aid protection layer 151 (S3). For example, as illustrated in FIG. 2C, the process of removing the first aid protection layer 151 (S3) may include dipping the first aid protection layer 151 in a solvent 11 stored in a container 10. For example, as illustrated in FIG. 2C, the interconnection substrate 100 (on which the first semiconductor chip 121 is mounted) may be turned upside down.

The solvent 11 may be an alkaline organic solvent including an alkaline compound, e.g., KOH and/or $Cu_7OH$. The alkaline organic solvent may reduce interfacial adhesion between the first semiconductor chip 121 and the first aid protection layer 151.

Then, as illustrated in FIG. 2D, the process of removing the first aid protection layer 151 (S3) may include separating the first aid protection layer 151 (having been dipped in the solvent 11) from the first semiconductor chip 121 using a suction device 20. For example, as illustrated in FIG. 2E, the method may include removing the first aid protection layer 151 from the first semiconductor chip 121.

Figure 2F:
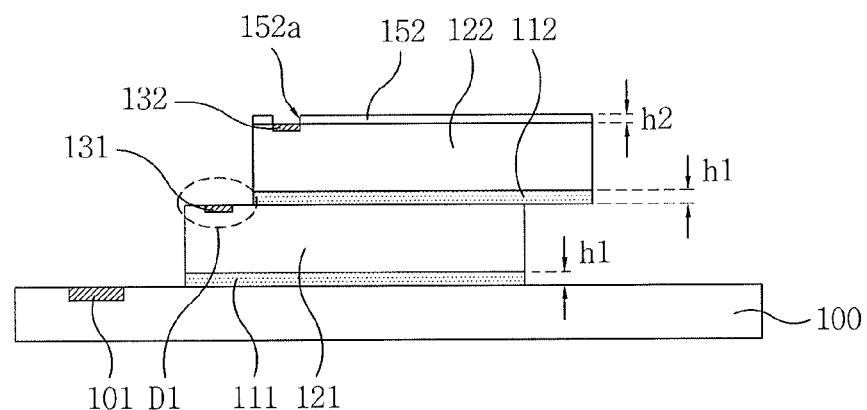

Then, as illustrated in FIG. 2F, the method may include a process of offset-stacking the second semiconductor chip 122 on the first semiconductor chip 121 (S4). For example, the offset stacking may include stacking the second semiconductor chip 122 such that the extension region D1 of the top surface of the first semiconductor chip 121 is exposed, e.g., the extension region D1 extends beyond an end of the second semiconductor chip 122.

Therefore, the second semiconductor chip 122 may be stacked on a region of the first semiconductor chip 121 other than the extension region D1 while contacting and/or overlying the first semiconductor chip 121.

Similar to the first semiconductor chip 121, the second semiconductor chip 122 may be stacked using a second adhesive layer 112. For example, after the second adhesive layer 112 is formed on a bottom surface of the second semiconductor chip 122, the second semiconductor chip 122 may be offset-stacked on the first semiconductor chip 121. The second adhesive layer 112 may have the same thickness as, or a similar thickness to, the first thickness h1 of the first adhesive layer 111.

The second semiconductor chip 122 may include a second chip pad 132 on an extension region D1 of the top surface of the second semiconductor chip 122. As previously described, the extension region D1 may be a region of the top surface of the second semiconductor chip 122 exposed during stacking of a third semiconductor chip 123 in a subsequent process. For example, the extension region D1 of the second semiconductor chip 122 may extend beyond an end of the third semiconductor chip 123 stacked thereon. The second chip pad 132 may be disposed on the second semiconductor chip 122 at a position closest or adjacent to the substrate pad 101.

A second aid protection layer 152 may cover the top surface of the second semiconductor chip 122. The second aid protection layer 152 may prevent the second semiconductor chip 122 from being damaged by, e.g., polishing and mounting processes. The second aid protection layer 152 may be formed of, e.g., a photosensitive polymer such as PSPI. The second aid protection layer 152 may include a hole 152a partially or entirely exposing the second chip pad 132.

Then, the method may include a process of determining whether a number of semiconductor chips 121 to 124 (stacked on the interconnection substrate 100) is N as desired (S6). For example, when the number of semiconductor chips 121 to 124 stacked on the interconnection substrate 100 is less than N, the processes S3 and S4 may be repeated, so that N semiconductor chips 121 to 124 may be stacked.

Figure 2G:
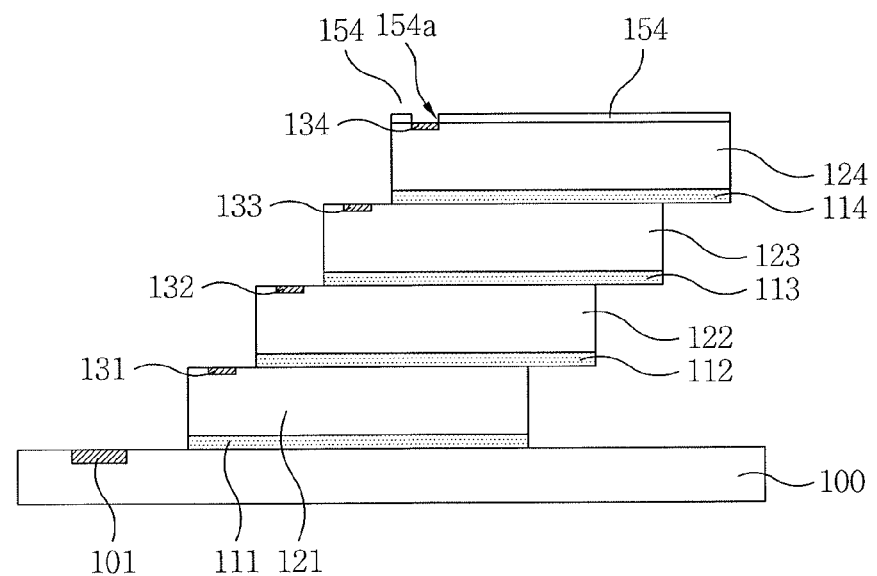

As illustrated in FIG. 1, four semiconductor chips 121 to 124 may be stacked to form the semiconductor package. Therefore, as illustrated in FIG. 2G, in the method of fabricating the semiconductor package according to the present embodiment, when the four semiconductor chips 121 to 124 are stacked on the interconnection substrate 100, the subsequent process may be performed. For example, a second protection layer 154 covering the top surface of semiconductor chip 124, e.g., the uppermost semiconductor chip of the semiconductor chips 121 to 124, may not be removed.

The second protection layer 154 may prevent the fourth semiconductor chip 124 from being damaged during, e.g., polishing and mounting processes. The second protection layer 154 may be formed of, e.g., a photosensitive polymer such as PSPI or a protection tape such as a UV tape. The second protection layer 154 may include a hole 154a exposing a fourth chip pad 134 of the fourth semiconductor chip 124.

Figure 2H:
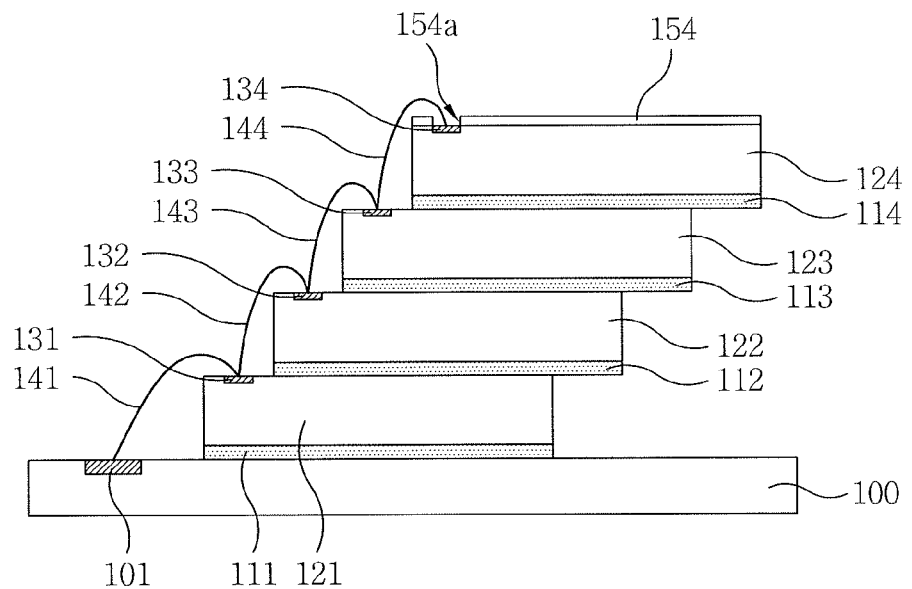

Next, as illustrated in FIG. 2H, the method may include a process of electrically connecting the chip pads 131 to 134 of the plurality of semiconductor chips 121 to 124 to the substrate pad 101 using bonding wires 141 to 144 (S6).

Figure 2I:
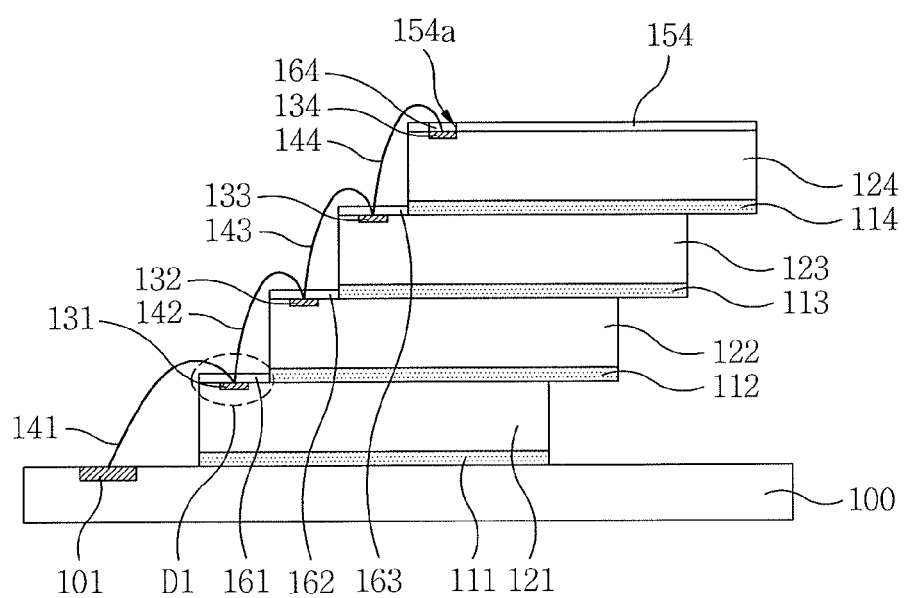

Then, as illustrated in FIG. 2I, the method may include a process of forming first protection layers 161 to 164 to cover the chip pads 131 to 134 (S7). For example, the first protection layers 161 to 164 may be formed on the extension regions D1 of the first to third semiconductor chips 121 to 123.

The first semiconductor chip 121 to the third semiconductor chip 123 may be stacked in a step form or structure such that the extension regions D1 of the respective top surfaces are exposed, e.g., the extension regions D1 extend beyond an end of the semiconductor chip stacked thereon. Accordingly, the chip pads 131 to 134 may have step differences to be exposed. Accordingly, the first protection layers 161 to 164 may uniformly cover the chip pads 131 to 134 regardless of the step differences between the chip pads 131 to 134.

For example, the method of forming the first protection layers 161 to 164 may include, e.g., spraying a liquid-phase source having adhesive properties or evaporating a source. The liquid-phase source may be easily sprayed and evaporated. Thus the first protection layers 161 to 164 may be easily formed. The liquid-phase source may be a liquid-phase polymer rather than a photosensitive polymer. Accordingly, the first protection layers 161 to 164 may be formed of a different material from the second protection layer 154 covering the top surface of the uppermost, e.g., fourth, semiconductor chip 124.

The first protection layers 161 to 164 may prevent the chip pads 131 to 134 from being damaged by external alpha particles or an alpha ray in subsequent processes. Accordingly, the first protection layers 161 to 164 may have a third thickness h3 such that the chip pads 131 to 134 may be sufficiently covered and/or protected.

Then, as illustrated in FIG. 1, the method may include a process of forming a molding layer 170 covering side and top surfaces of the plurality of semiconductor chips 121 to 124 (S8). Accordingly, a semiconductor package according to the present embodiment may be completed. The molding layer 170 may be formed of, e.g., an epoxy molding compound (EMC).

In an implementation, the method may include a process of removing a solvent included in the first protection layers 161 to 164 prior to forming the molding layer 170. Accordingly, the thickness h3 of the first protection layers 161 to 164 may be reduced.

As a result, in the semiconductor package and the method of fabricating the same, after the aid protection layers (preventing damage during polishing and mounting processes) are removed, the semiconductor chips may be offset-stacked. Accordingly, the aid protection layer may not remain between the plurality of semiconductor chips. Therefore, the volume of the semiconductor chips stacked on the semiconductor package may be reduced.

Figure 4:
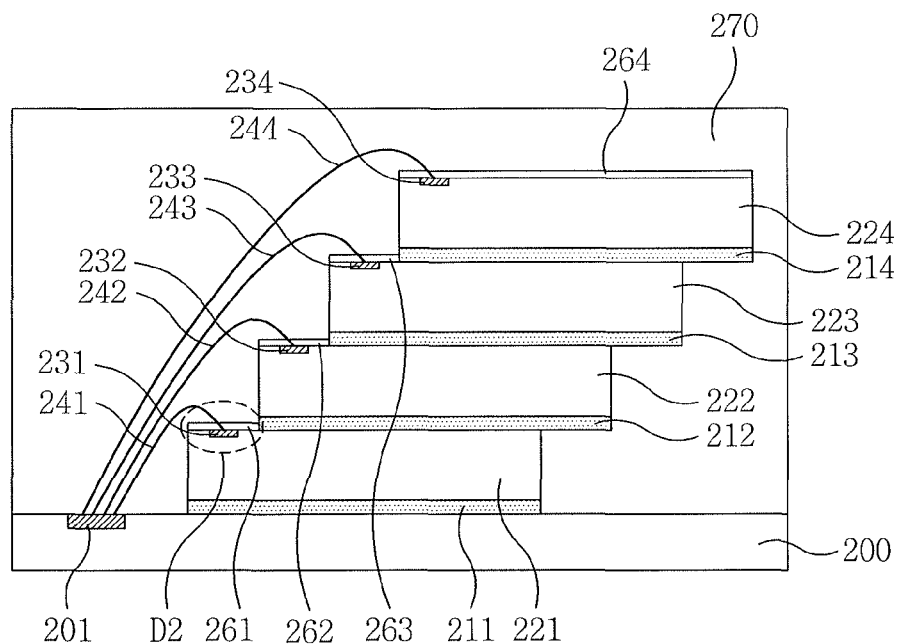
FIG. 4 illustrates a cross-sectional view of a semiconductor package according to another embodiment.

FIG. 4 illustrates a cross-sectional view of a semiconductor package according to another embodiment.

Referring to FIG. 4, a semiconductor package according to the present embodiment may include a interconnection substrate 200, a plurality of semiconductor chips 221 to 224 stacked on the interconnection substrate 200 in a step form of structure (such that extension regions D2 of top surfaces thereof extend beyond an end of a semiconductor chip stacked thereon), a plurality of protection layers 261 to 264 (covering the extension regions D2 and a top surface of an uppermost semiconductor chip 224 of the plurality of semiconductor chips 221 to 224), and a molding layer 270 (covering side and top surfaces of the semiconductor chips 221 to 224).

Here, similar to the previous embodiment, the plurality of semiconductor chips 221 to 224, moving away from the interconnection substrate 200, may be sequentially referred to as a first semiconductor chip 221, a second semiconductor chip 222, a third semiconductor chip 223, and a fourth semiconductor chip 224, respectively.

The interconnection substrate 200, the plurality of semiconductor chips 221 to 224, and the molding layer 270 may be understood as the same or similar components as the interconnection substrate 100, the plurality of interconnection substrate 121 to 124, and the molding layer 170 of the semiconductor package according to the previous embodiment. Therefore, repeated detailed descriptions thereof will be omitted.

In addition, the semiconductor package according to the present embodiment may include a substrate pad 201, adhesive layers 211 to 214, and chip pads 231 to 234, which are of a similar constitution to the substrate pad 101, the adhesive layers 111 to 114, and the chip pads 131 to 134 of the semiconductor package according to the previous embodiment. Therefore, the description thereof may be understood from that described above.

Only differences from the semiconductor package according to the previous embodiment will be briefly described.

In the semiconductor package according to the present embodiment, the chip pads 231 to 234 of the plurality of semiconductor chips 221 to 224 may be electrically connected to the substrate pad 201 using bonding wires 241 to 244. For example, the plurality of semiconductor chips 221 to 224 may be individually and electrically connected to the interconnection substrate 200.

The protection layers 261 to 264 may include third protection layers 261 to 263 (covering extension regions D2 of the top surfaces of the first semiconductor chip 221 to the third semiconductor chip 223), and a fourth protection layer 264 (covering an entire top surface of the uppermost, e.g., fourth, semiconductor chip 224).

The protection layers 261 to 264 may prevent the plurality of semiconductor chips 221 to 224 from being damaged by external alpha particles or an alpha ray. The protection layers 261 to 264 may include second holes 251a to 254a overlying the chip pads 231 to 234.

The third protection layers 261 to 263 may be formed of the same material as the fourth protection layer 264. The protection layers 261 to 264 may be formed of an adhesive material. For example, the third and fourth protection layers 261 to 264 may be formed of a liquid-phase adhesive material. In an implementation, the third and fourth protection layers 261 to 264 may be formed of a photosensitive polymer, e.g., PSPI.

FIGS. 5A to 5E illustrate cross-sectional views of stages in a method of fabricating the semiconductor package of FIG. 4. Only differences from the method of fabricating a semiconductor package according to the previous embodiment will be described below.

Figure 5A:
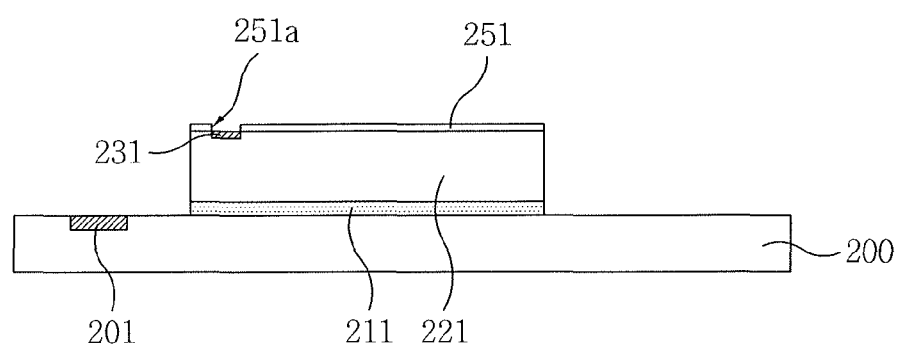
FIGS. 5A to 5E illustrate cross-sectional views of stages in a method of fabricating the semiconductor package of FIG. 4.

As illustrated in FIG. 5A, the method may include a process of mounting a first semiconductor chip 221 (including a first chip pad 231 and a first aid protection layer 251) on a interconnection substrate 200. The first aid protection layer 251 may prevent physical and chemical damage of a top surface of the semiconductor chip 221 and/or the chip pad 231 by polishing and mounting processes. The first aid protection layer 251 may be formed of, e.g., a photosensitive polymer such as PSPI or a protection tape such as a UV tape. The first aid protection layer 251 may include a hole 251a overlying the first chip pad 231.

Figure 5B:
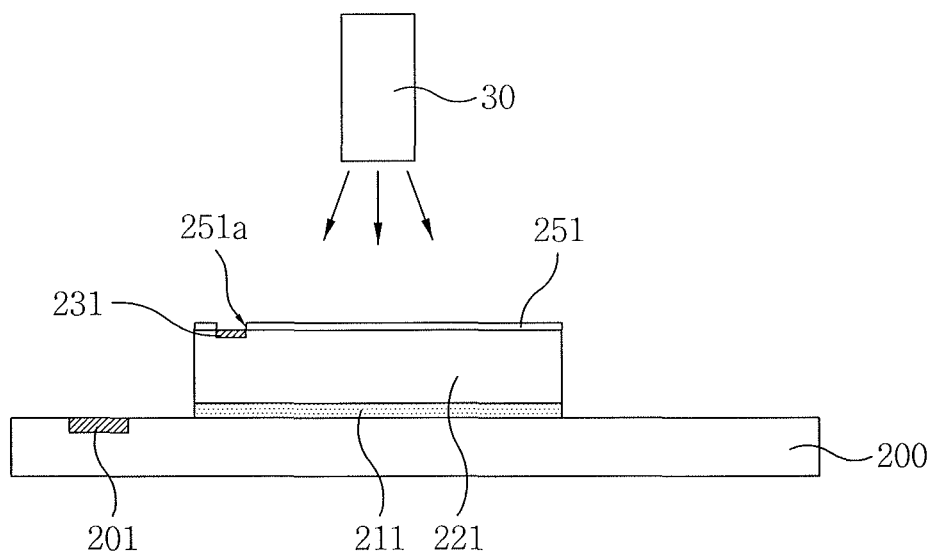
Figure 5C:
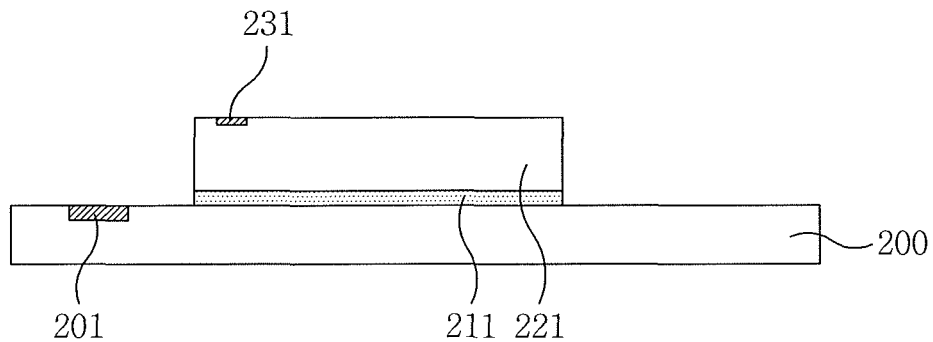

Then, as illustrated in FIGS. 5B and 5C, the method may include a process of irradiating a laser or UV rays on the first semiconductor chip 221 to remove the first aid protection layer 251. For example, the process of irradiating the UV rays on the first semiconductor chip 221 may be performed when the first aid protection layer 251 is formed of a UV tape.

Figure 5D:
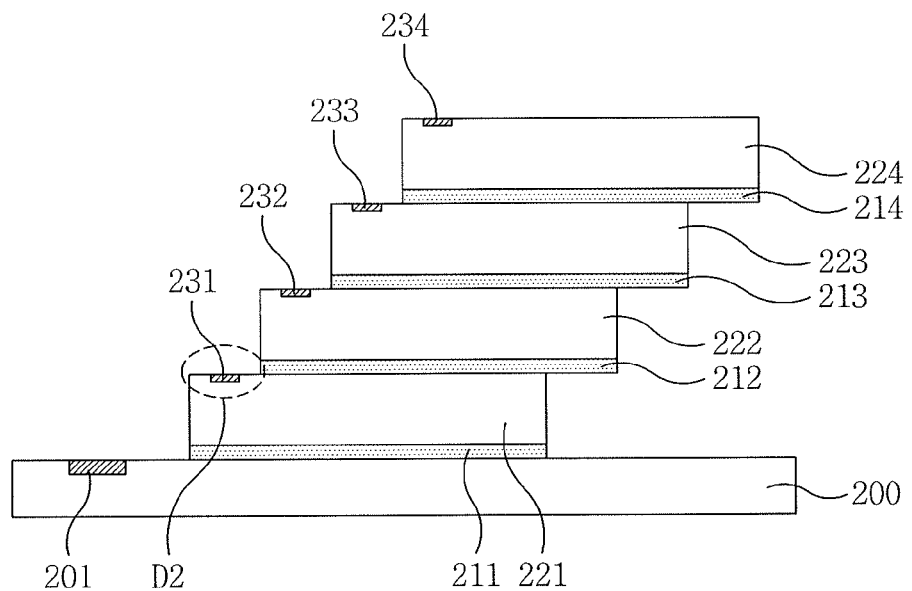

Next, as illustrated in FIG. 5D, the method may include a process of repeating the above-described process of offset-stacking a second semiconductor chip 222 to fourth semiconductor chip 224 on the first semiconductor chip 221. For example, the offset stack may denote that the second semiconductor chip 222 to the uppermost, e.g., fourth, semiconductor chip 224 are stacked to expose extension regions D2 of top surfaces of first semiconductor chip 221 to third semiconductor chip 223 (at lower portions of the stack). The extension regions D2 may be portions of the top surfaces of the first semiconductor chip 221 to the third semiconductor chip 223 exposed by the second semiconductor chip 222 to the fourth semiconductor chip 224 stacked in the subsequent process. For example, the extension region D2 may extend beyond an end of the semiconductor chip stacked thereon.

Accordingly, in the method according to the present embodiment, after a fourth aid protection layer (not shown) covering the top surface of the uppermost, e.g., fourth, semiconductor chip 224 is removed, the processes described below may be performed.

Figure 5E:
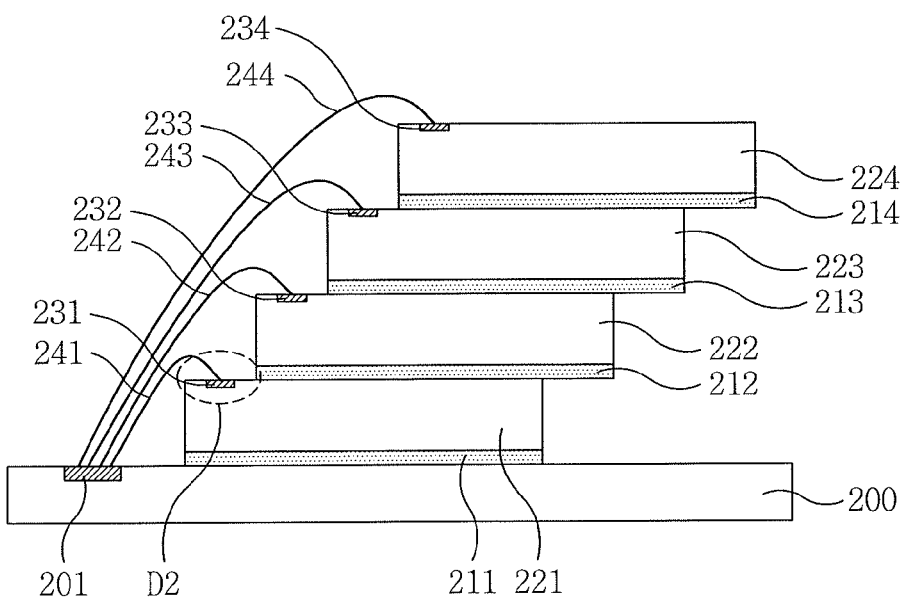

Then, as illustrated in FIG. 5E, a process of electrically connecting chip pads 231 to 234 of the semiconductor chips 221 to 224 to the substrate pad 201 using bonding wires 241 to 244 may be performed.

Then, as illustrated in FIG. 4, a process of forming protection layers 261 to 264 on the extension regions D2 of the first semiconductor chip 221 to the third semiconductor chip 223, and on the entire top surface of the fourth semiconductor chip 224, may be performed. For example, the protection layers 261 to 264 may cover the chip pads 231 to 234.

As a result, in the semiconductor package and the method of fabricating the same according to the present embodiment, the aid protection layers (on each semiconductor chip that prevent damage caused by polishing and mounting processes) may be removed using a laser or UV, and offset-stacking may be performed. Then, a plurality of as many semiconductor chips as desired may be stacked and wire bonded. Then, protection layers may be formed on exposed top surfaces of the plurality of semiconductor chips using, e.g., a liquid source. Accordingly, a simplified process may facilitate a reduction in the volume of the semiconductor chips stacked in the semiconductor package.

Figure 6:
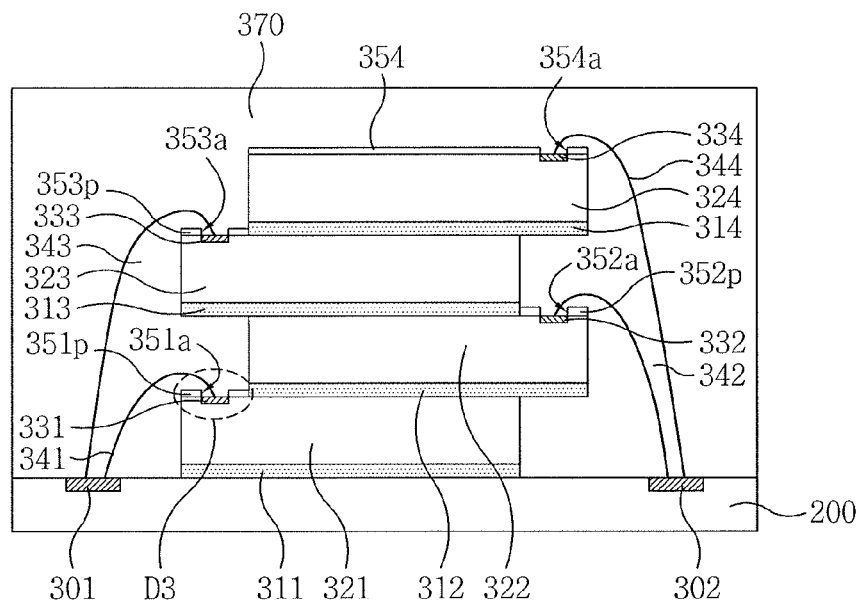
FIG. 6 illustrates a cross-sectional view of a semiconductor package according to yet another embodiment.

FIG. 6 illustrates a cross-sectional view of a semiconductor package according to yet another embodiment.

Referring to FIG. 6, a semiconductor package according to the present embodiment may include a interconnection substrate 300, a plurality of semiconductor chips 321 to 324 (stacked on the interconnection substrate 300 in a zigzag form or structure and including extension regions D3), a plurality of protection layers 351p to 353p and 354 (covering the extension regions D3 and a top surface of an uppermost semiconductor chip 324 of the plurality of semiconductor chips 321 to 324), and a molding layer 370 (covering side and top surfaces of the semiconductor chips 321 to 324).

The plurality of semiconductor chips 321 to 324, moving away from the third interconnection substrate 300, may sequentially be referred to as a first semiconductor chip 321, a second semiconductor chip 322, a third semiconductor chip 323, and a fourth semiconductor chip 324.

The interconnection substrate 300, the plurality of semiconductor chips 321 to 324, and the molding layer 370 may be understood as being the same as or similar to the interconnection substrate 100, the plurality of semiconductor chips 121 to 124, and the molding layer 170 of the semiconductor package according to the previous embodiment. Therefore, repeated detailed descriptions thereof will be omitted.

In addition, the semiconductor package according to the present embodiment may include adhesive layers 311 to 314, chip pads 331 to 334, bonding wires 341 to 344, and the protection layers 351p to 353p and 354 (having a similar constitution to the adhesive layers 211 to 214, the chip pads 231 to 234, the bonding wires 241 to 244, and the protection layers 251p to 253p and 254 of the semiconductor package according to the previous embodiment). Accordingly, a description thereof may be understood from those described in the previous embodiments.

Only differences from the semiconductor package according to the previous embodiments will be briefly described.

The plurality of semiconductor chips 321 to 324 may be stacked in a zigzag form or structure. Therefore, extension regions D3 exposed by the semiconductor chips 321 to 324 that are disposed on the semiconductor chips 321 to 324 to be adjacent thereto may be arranged in a zigzag form. In addition, a plurality of chip pads 331 to 334 on the extension regions D3 of the semiconductor chips 321 to 324, respectively, may be arranged in a zigzag form as well.

Accordingly, the interconnection substrate 300 may include a first substrate pad 301 at one end of a top surface thereof and a second substrate pad 302 at another end of the top surface thereof. The first substrate pad 301 and the second substrate pad 302 may be formed of the same metal material. For example, the first substrate pad 301 and the second substrate pad 302 may be formed of one of Au, Ag, Cu, Ni, Al, Sn, Pb, Pt, Bi, In, and alloys thereof.

The chip pads 331 to 334 may be electrically connected to the first substrate pad 301 or the second substrate pad 302, depending on the location where the corresponding chip of the plurality of semiconductor chips 321 to 324 is stacked. For example, the first chip pad 331 and the third chip pad 333 may be electrically connected to the first substrate pad 301; and he second chip pad 332 and the fourth chip pad 334 may be electrically connected to the second substrate pad 302.

FIGS. 7A to 7G illustrate cross-sectional views of stages in a method of fabricating the semiconductor package of FIG. 6. Only differences from the method of fabricating the semiconductor package according to the previous embodiments will be briefly described below.

Figure 7A:
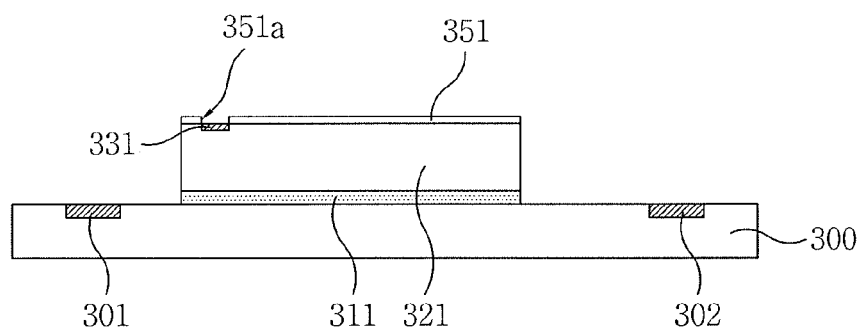
FIGS. 7A to 7G illustrate cross-sectional views of stages in a method of fabricating the semiconductor package of FIG. 6.

As illustrated in FIG. 7A, the method may include a process of mounting a first semiconductor chip 321 on an interconnection substrate 300 (including a first substrate pad 301 and a second substrate pad 302). The first substrate pad 301 and the second substrate pad 302 may be disposed at respective ends of the interconnection substrate 300. The first semiconductor chip 321 may include a first chip pad 331 and a first aid protection layer 351. The first aid protection layer 351 may include a hole 351a exposing the first chip pad 331. For example, the hole 351a may be used during testing of the first semiconductor chip 321.

Figure 7B:
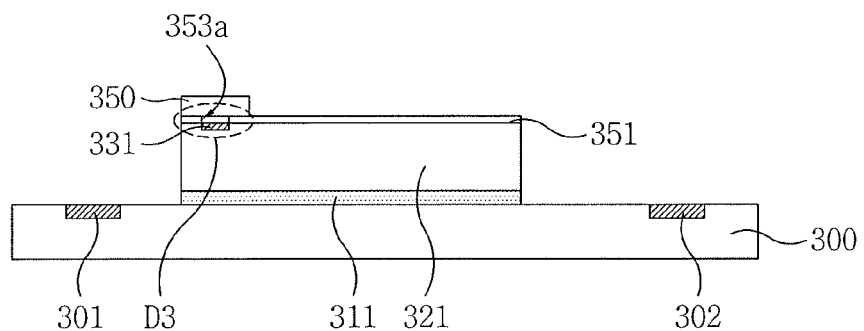

Next, as illustrated in FIG. 7B, the method may include a process of forming a mask pattern 350 exposing an extension region D3 on the first semiconductor chip 321. The extension region D3 may be a portion of a top surface of the first semiconductor chip 321 exposed by a second semiconductor chip 322 to be stacked thereon in a subsequent process. For example, the extension region D3 may extend beyond an end of the second semiconductor chip 322 when the second semiconductor chip 322 is stacked on the first semiconductor chip 321.

Figure 7C:
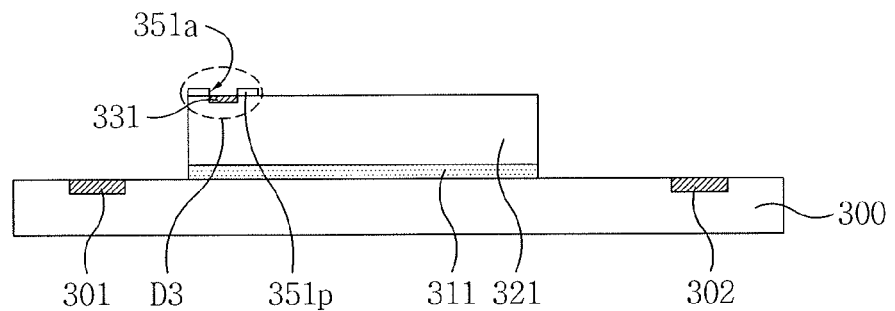

Then, as illustrated in FIG. 7C, the method may include a process of etching portions of the first aid protection layer 351 using the mask pattern 350 to form a first protection layer 351p. The first protection layer 351p may include the hole 351a.

Figure 7D:
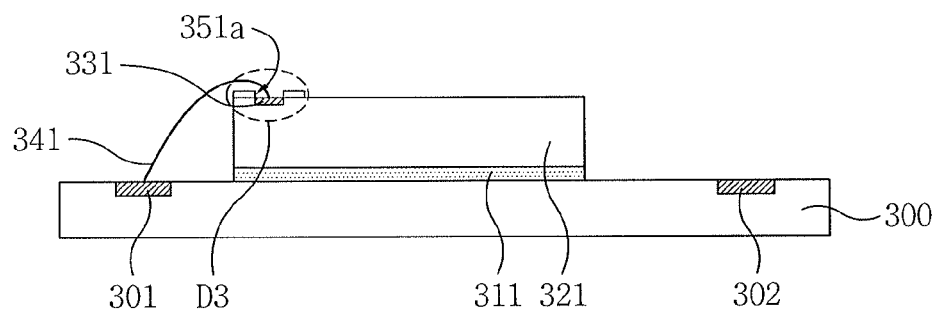

Then, as illustrated in FIG. 7D, the method may include a process of electrically connecting the first chip pad 331 to the first substrate pad 301 using a first bonding wire 341.

Figure 7E:
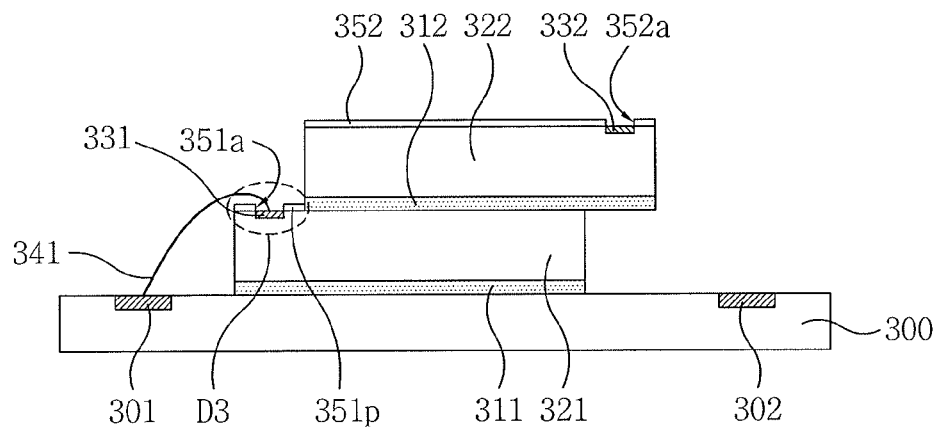

Then, as illustrated in FIG. 7E, the method may include a process of offset-stacking the second semiconductor chip 322 on the first semiconductor chip 321. The offset-stacking may refer to stacking the second semiconductor chip 322 on the first semiconductor chip 321 to expose the extension region D3 of the first semiconductor chip 321.

The second semiconductor chip 322 may include a second chip pad 332 and a second aid protection layer 352. The second aid protection layer 352 may include a hole 352a exposing the second chip pad 332.

The second chip pad 332 of the second semiconductor chip 322 may be disposed at an opposite end of the second semiconductor chip 322 relative to the first chip pad 331 of the first semiconductor chip 331. For example, referring to FIG. 7E, the first chip pad 331 may be disposed on a left end of the top surface of the first semiconductor chip 321; and the second chip pad 332 may be disposed on a right end of the top surface of the second semiconductor chip 322.

Figure 7F:
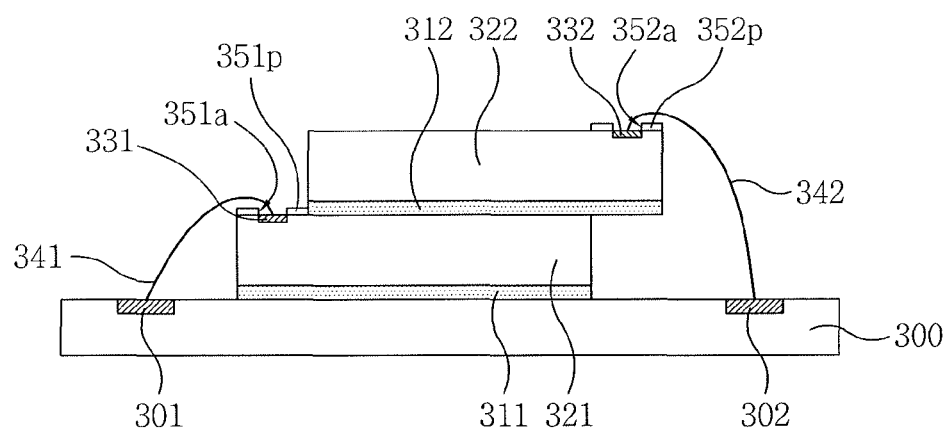

Then, as illustrated in FIG. 7F, the method may include a process of partially removing the second aid protection layer 352 to form a second protection layer 352p. The second protection layer 352p may include the hole 352a. The process of partially removing the second aid protection layer 352 may be performed using a mask pattern 350 in a similar manner to the process of partially removing the first aid protection layer 351.

Here, as previously described, the second chip pad 332 may be disposed at or near an edge in an opposite direction relative to the first chip pad 331. Accordingly, the second protection layer 352p may be disposed at or near an edge in an opposite direction to the first protection layer 351p. For example, a portion of the second aid protection layer 352 overlying the first semiconductor chip 321 may be removed.

Then, the method may include a process of electrically connecting the second chip pad 332 to the second substrate pad 302 using a second bonding wire 342.

Figure 7G:
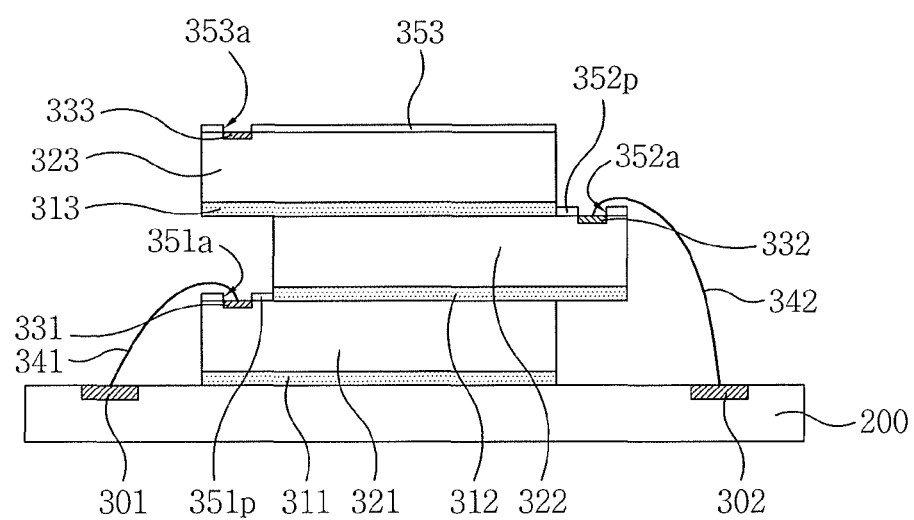

As illustrated in FIG. 7G, the method may include a process of offset-stacking a third semiconductor chip 323 on the second semiconductor chip 322. For example, the third semiconductor chip 323 may be stacked on a region of the second semiconductor chip 322 overlapping the first semiconductor chip 321.

As a result, in the semiconductor package and the method of fabricating the same according to the present embodiment, the protection layers stacked on each semiconductor chip may be removed in a zigzag form or structure in the order in which they were stacked. Accordingly, the semiconductor package and the method of fabricating the same according to the present embodiment may facilitate a reduction in volume of the plurality of semiconductor chips stacked in the zigzag form or structure.

Figure 8:
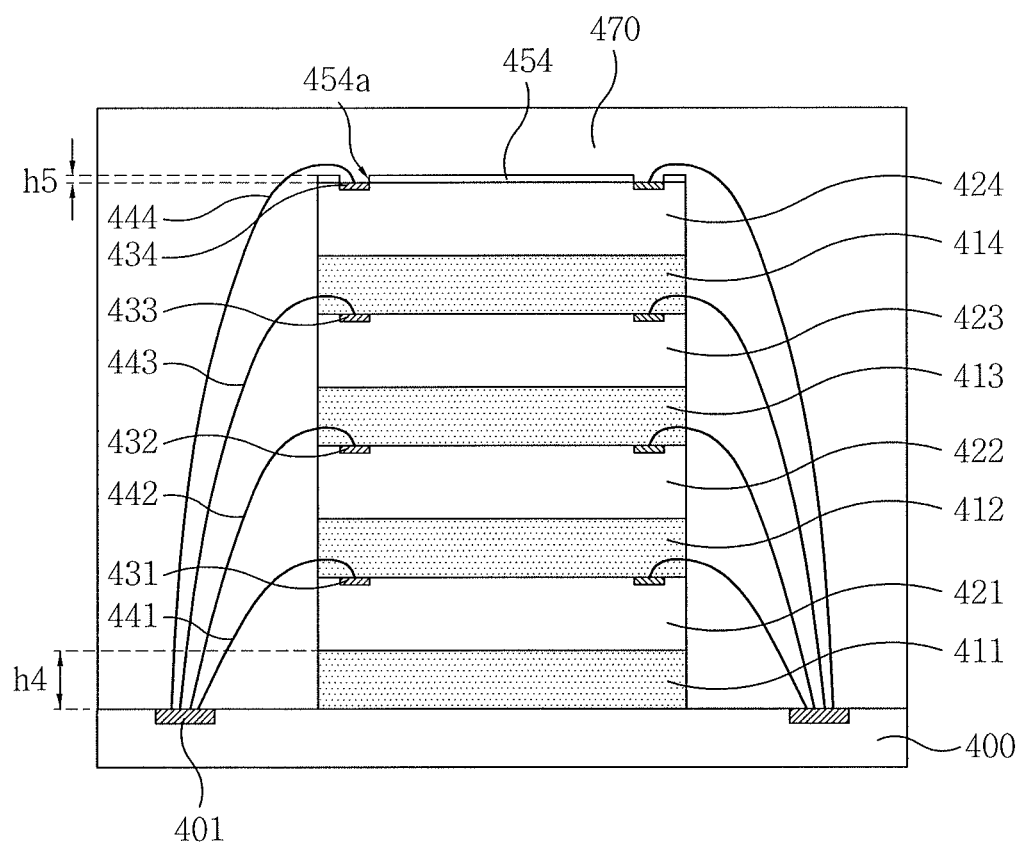
FIG. 8 illustrates a cross-sectional view of a semiconductor package according to still another embodiment.

FIG. 8 illustrates a cross-sectional view of a semiconductor package according to still another embodiment.

Referring to FIG. 8, the semiconductor package according to the present embodiment may include a interconnection substrate 400, a plurality of semiconductor chips 421 to 424 (vertically stacked on the interconnection substrate 400), a fifth protection layer 454 (covering an uppermost semiconductor chip 424 of the stacked semiconductor chips 421 to 424), and a molding layer 470 (covering the plurality of semiconductor chips 421 to 424).

Here, the plurality of semiconductor chips 421 to 424, moving away from the interconnection substrate 400, may sequentially be referred to as a first semiconductor chip 421, a second semiconductor chip 422, a third semiconductor chip 423, and a fourth semiconductor chip 424, which is similar to the previous embodiment.

The interconnection substrate 400, the plurality of semiconductor chips 421 to 424, the fifth protection layer 454, and the molding layer 470 may be understood as the same components as the interconnection substrate 100, the plurality of interconnection substrates 121 to 124, the second protection layer 154, and the molding layer 170 of the semiconductor package according to the previous embodiment. Therefore, repeated detailed descriptions thereof will be omitted.

In addition, the semiconductor package according to the present embodiment may include adhesive layers 411 to 414, chip pads 431 to 434, and bonding wires 441 to 444, which may be of a similar constitution to those of the semiconductor according to the previous embodiments. Therefore, the description thereof may be understood from those described in the first to third embodiments.

Only differences from the semiconductor package according to the previous embodiments will be briefly described.

In the semiconductor package according to the present embodiment, the plurality of semiconductor chips 421 to 424 may be vertically stacked. Accordingly, the chip pads 431 to 434 may be disposed between the plurality of semiconductor chips 421 to 424. Therefore, each of the adhesive layers 411 to 414 may have a fourth thickness h4 such that the bonding wires 441 to 444 are prevented from contacting bottom surfaces of the semiconductor chips 421 to 424 stacked adjacent to top surfaces of the chips 421 to 424. The fourth thickness h4 may be, e.g., about 60 μm to about 80 μm.

FIGS. 9A to 9D illustrate cross-sectional views of stages in a method of fabricating the semiconductor package of FIG. 8. Only differences from the method of fabricating the semiconductor package according to the previous embodiments will be briefly described.

Figure 9A:
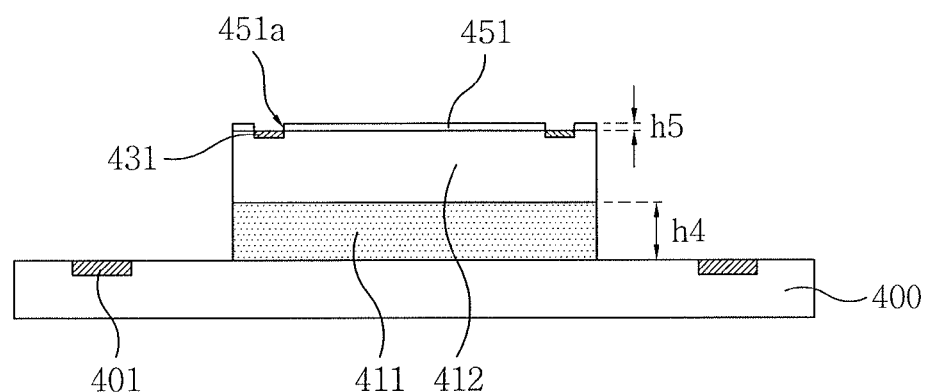
FIGS. 9A to 9D illustrate cross-sectional views of stages in a method of fabricating the semiconductor package of FIG. 8.

As illustrated in FIG. 9A, the method may include a process of mounting a first semiconductor chip 421 on a interconnection substrate 400 using a first adhesive layer 411. The first adhesive layer 411 may have the fourth thickness h4. The first adhesive layer 411 may be formed on the interconnection substrate 400 to avoid overlapping a pair of substrate pads 401.

The first semiconductor chip 421 may include a pair of first chip pads 431 and a first aid protection layer 451 having a fifth thickness h5. The first aid protection layer 451 may prevent the first semiconductor chip 421 from being damaged during polishing and mounting processes. The fifth thickness h5 may be, e.g., about 10 μm to about 20 μm. The first aid protection layer 451 may include holes 451a exposing the pair of chip pads 451.

Figure 9B:
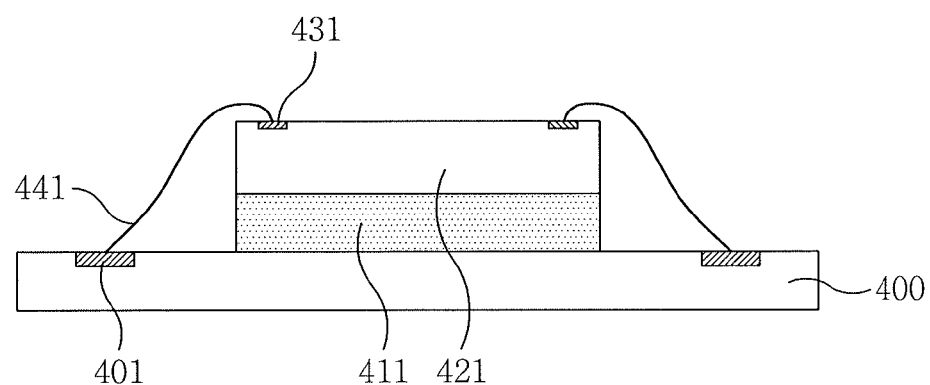

Then, as illustrated in FIG. 9B, the method may include a process of removing the first aid protection layer 451 and electrically connecting the first chip pads 431 to respective substrate pads 401 using first bonding wires 441.

Figure 9C:
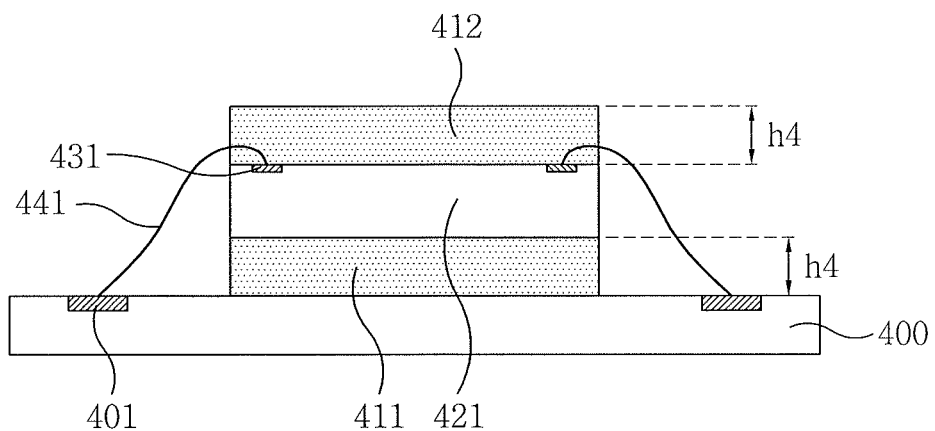

Next, as illustrated in FIG. 9C, the method may include a process of forming a second adhesive layer 412 on the first semiconductor chip 421. The second adhesive layer 412 may have the fourth thickness h4. The fourth thickness h4 may be thicker than a height of the bent first bonding wire 441. For example, the fourth thickness h4 may be about 60 μm to about 80 μm.

As described above, the first adhesive layer 411 may have the same thickness as the second adhesive layer 412. However, bonding wires 441 to 444 may not be disposed below the first adhesive layer 411. Therefore, in an implementation, the first adhesive layer 411 may have a thickness thinner than the thickness of the second adhesive layer 412. For example, the first adhesive layer 411 may have a minimum thickness sufficient to bond the interconnection substrate 400 to the first semiconductor chip 421. In an implementation, the first adhesive layer 411 may have a thickness of about 10 μm to about 20 μm.

Figure 9D:
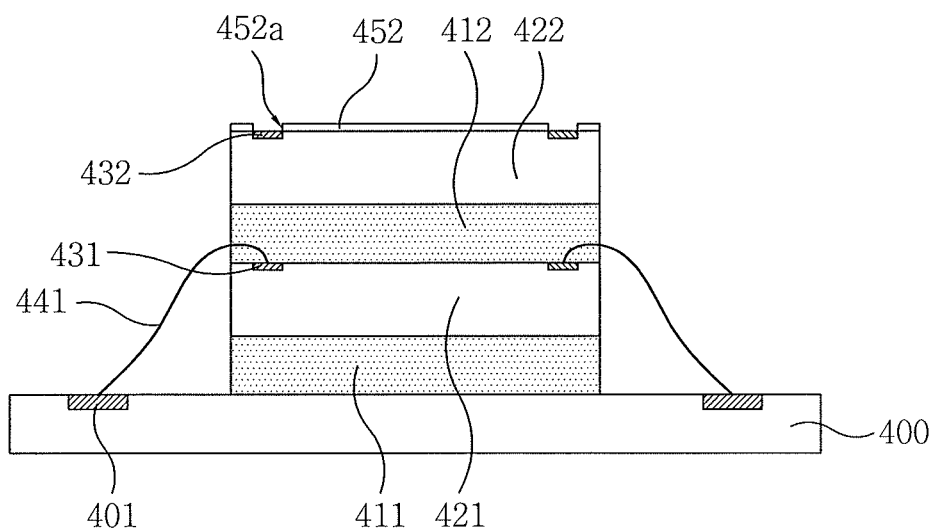

Then, as illustrated in FIG. 9D, the method may include a process of stacking a second semiconductor chip 422 on the second adhesive layer 412. Here, the thickness h4 of the second adhesive layer 412 may facilitate spacing apart of a bottom surface of the second semiconductor chip 422 from the first bonding wires 441.

As a result, in the semiconductor package and the method of fabricating the same according to the present embodiment, the aid protection layer (that covers the top surface of the semiconductor chip and prevents damage caused by polishing and mounting processes) may be removed. Then, after forming the adhesive layer having a sufficient thickness on the top surface of the semiconductor chip, another semiconductor chip may be stacked thereon. Accordingly, the volume of the plurality of semiconductor chips stacked in the vertically stacked semiconductor package may be reduced.

Figure 10:
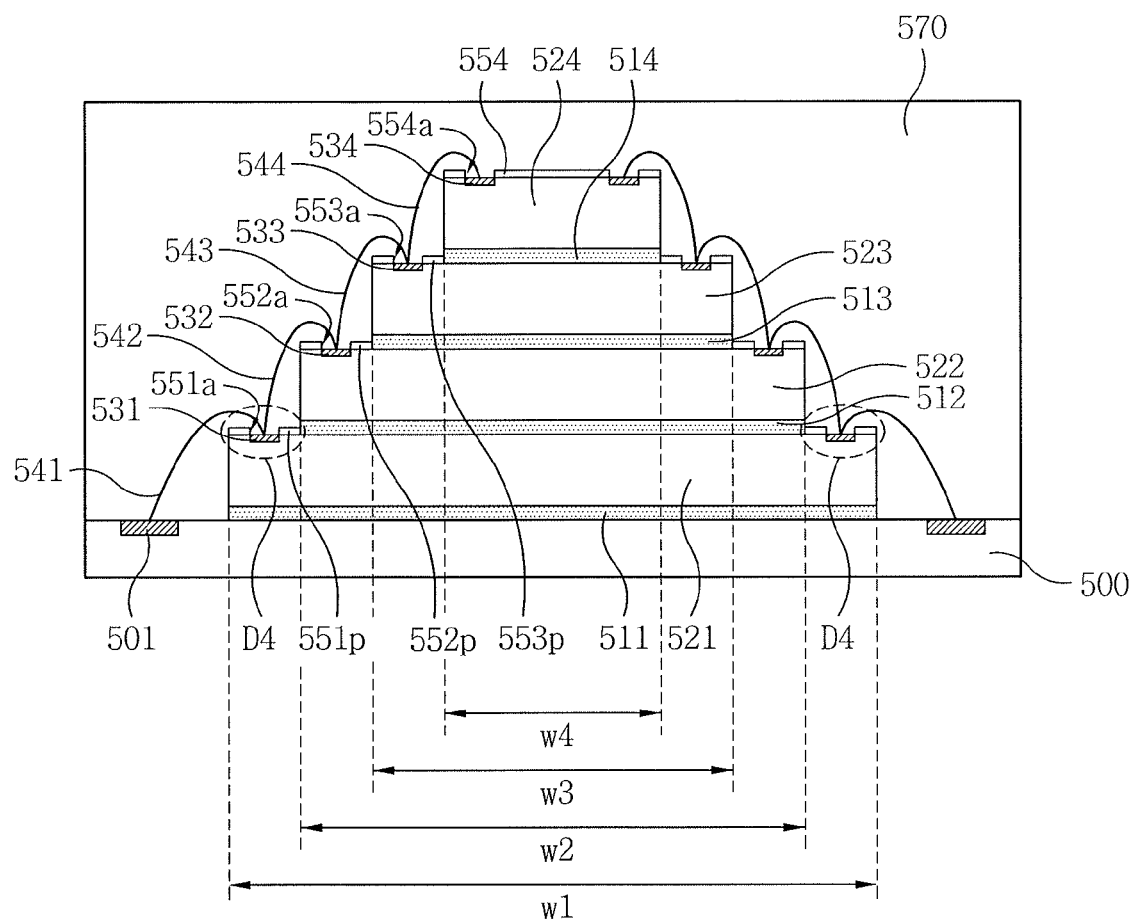
FIG. 10 illustrates a cross-sectional view of a semiconductor package according to still another embodiment.

FIG. 10 illustrates a cross-sectional view of a semiconductor package according to still another embodiment.

Referring to FIG. 10, the semiconductor package according to the present embodiment may include a interconnection substrate 500, a plurality of semiconductor chips 521 to 524 (stacked on the interconnection substrate 500 and having different widths from one another), a plurality of protection layers 551p to 553p and 554 (on extending portions of top surfaces of the plurality of semiconductor chips 521 to 524 and on an entire top surface of an uppermost semiconductor chip 524), and a molding layer 570 (covering side and top surfaces of the semiconductor chips 521 to 524).

Here, the plurality of semiconductor chips 521 to 524, moving away from the interconnection substrate 500, may sequentially be referred to as a first semiconductor chip 521, a second semiconductor chip 522, a third semiconductor chip 523, and a fourth semiconductor chip 524, which is similar to the previous embodiment.

The interconnection substrate 500 and the molding layer 570 may be understood to be the same components as or similar to the interconnection substrate 100 and the molding layer 170 of the semiconductor package according to the previous embodiments. Therefore, repeated detailed descriptions thereof will be omitted.

In addition, the semiconductor package according to the present embodiment may include chip pads 531 to 534, bonding wires 541 to 544, adhesive layers 511 to 514, and a plurality of protection layers 551p to 553p and 554, which may be of a similar constitution to those of the semiconductor according to the previous embodiments. Therefore, the description thereof may be understood from those described in the previous embodiments.

Only differences from the semiconductor package according to the previous embodiments will be briefly described below.

The plurality of semiconductor chips 521 to 524 may have different first to fourth widths w1 to w4, respectively. For example, the first semiconductor chip 521 (mounted on the interconnection substrate 500) may have a first width w1. The second semiconductor chip 522 (stacked on the first semiconductor chip 521) may have a second width w2 smaller than the first width w1. The third semiconductor chip 523 (stacked on the second semiconductor chip 522) may have a third width w3 smaller than the second width w2. The fourth semiconductor chip (stacked on the third semiconductor chip 523) may have a fourth width w4 smaller than the third width w3. Therefore, the widths of the plurality of semiconductor chips 521 to 524 may decrease as they are farther from the interconnection substrate 500.

In FIG. 10, it is illustrated that the plurality of semiconductor chips 521 to 524 are stacked in a pyramid form. However, the embodiments are not limited thereto, and the plurality of semiconductor chips 521 to 524 may be stacked in various forms.

Figure 11A:
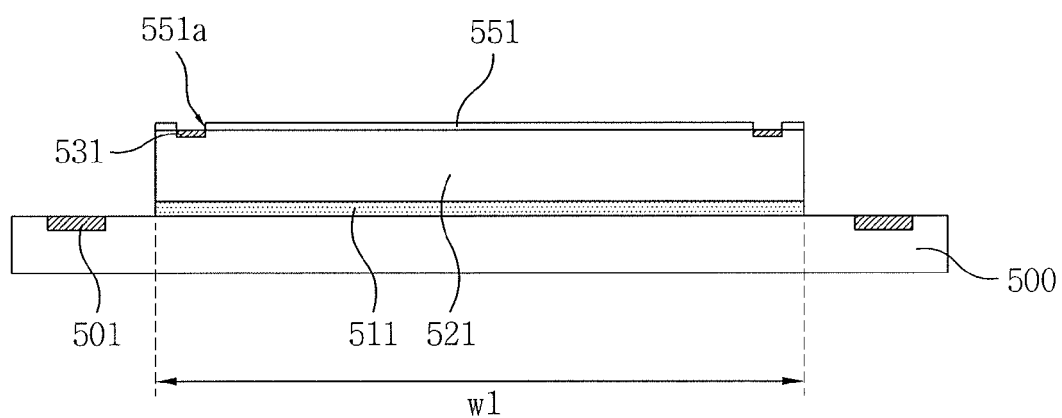
FIGS. 11A to 11C illustrate cross-sectional views of stages in a method of fabricating the semiconductor package of FIG. 10.
Figure 11B:
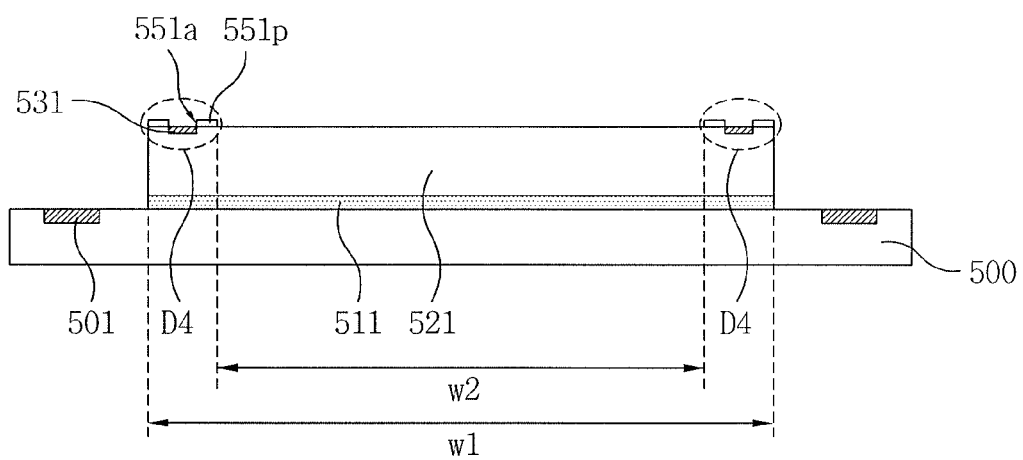
Figure 11C:
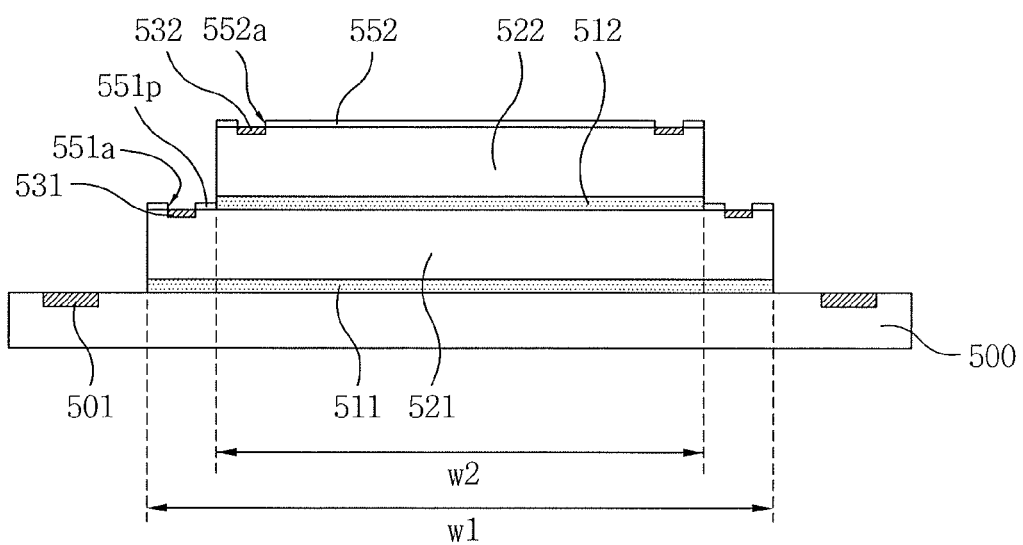

FIGS. 11A to 11C illustrate cross-sectional views of stages in a method of fabricating the semiconductor package of FIG. 10. Only differences from the semiconductor package according to the previous embodiments will be briefly described below.

As illustrated in FIG. 11A, the method may include a process of mounting a first semiconductor chip 521 (having the first width w1) on a interconnection substrate 500 using a first adhesive layer 511.

Then, as illustrated in FIG. 11B, the method may include a process of partially removing a first aid protection layer 551 (formed on the first semiconductor chip 521) to form a first protection layer 551p. In an implementation, the portion of the first aid protection layer 551 removed may have a second width w2, which may be smaller than the first width w1. The second width w2 may also correspond to the width of the second semiconductor chip 522 to be stacked on the first semiconductor chip 521 in a subsequent process.

A portion of the first semiconductor chip 521 including the first protection layer 551p thereon may be the extension region D4 exposed by the second semiconductor chip 522 to be stacked thereon. In an implementation, the first protection layer 551p may include a hole 551a exposing a first chip pad 531 of the first semiconductor chip 521.

Then, as illustrated in FIG. 11C, the method may include a process of stacking the second semiconductor chip 522 on the portion of the first semiconductor chip 521 where the first aid protection layer 551 has been removed.

As a result, in the semiconductor package and the method of fabricating the same according to the present embodiment, the aid protection layer that prevents damage caused by polishing and mounting processes may be partially removed; and the plurality of semiconductor chips having different widths may be stacked. Accordingly, the process of reducing the volume of a stacked semiconductor package including a plurality of semiconductor chips that have different widths may be minimized.

Figure 12:
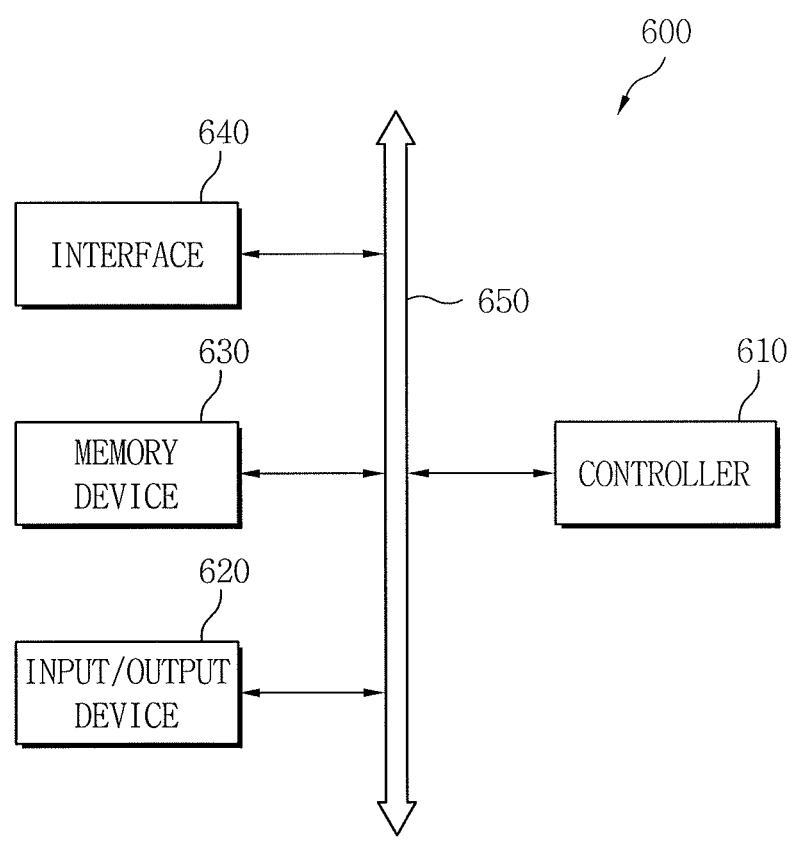
FIG. 12 schematically illustrates a configuration of an electronic system employing a semiconductor package according to an embodiment.

FIG. 12 illustrates a configuration of an electronic system employing a semiconductor package according to an embodiment.

Referring to FIG. 12, an electronic system 600 according to the present embodiment may include a controller 610, an input/output device 620, a memory device 630, an interface 640, and a bus structure 650. The memory device 630 may include one ore more semiconductor packages of the embodiments described with reference to FIGS. 1 to 11. The bus structure 650 may provide a path via which data are transferred between the controller 610, the input/output device 620, the memory device 630, and the interface 640.

The controller 610 may include at least one microprocessor, a digital signal process, a micro controller, and at least one of logic devices capable of performing similar functions to them. The input/output device 620 may include at least one of a keypad, a keyboard, and a display device. The memory device 630 may store commands executed by data and/or the controller 610.

The memory device 630 may include a semiconductor package formed of one of a volatile memory chip such as a dynamic random access memory (DRAM) or a static random access memory (SRAM), a non-volatile memory chip such as a flash memory, a phase change memory, a magnetic random access memory (MRAM) or a resistive random access memory (RRAM) and a combination thereof.

The interface 640 may transmit data to a communication network or receive data from a communication network. The interface 640 may be in a wired or wireless form. For example, the interface 640 may include an antenna or a wired/wireless transceiver. An application chipset, a camera image processor (CIS), and an input/output unit may be further provided in the electronic system 600.

The electronic system 600 may be implemented as a mobile system, a personal computer, an industrial computer or a logic system performing various functions. For example, the mobile system may be one of a personal digital assistant (PDA), a web tablet, a mobile phone, a wireless phone, a laptop computer, a memory card, a digital music system and an information transmission/reception system. When the electronic system 600 is equipment capable of performing wireless communications, the electronic system 600 may be used for communication systems such as code division multiple access (CDMA), global system for mobile communication (GSM), North American Digital Cellular (NADC), enhanced-time division multiple access (E-TDMA), wideband code division multiple access (WCDAM), and CDMA2000.

The semiconductor package and the method of fabricating the same according to the embodiments may minimize the volume of a stacked discrete semiconductor chip. Accordingly, a greater number of semiconductor chips may be stacked within the same volume. For example, the semiconductor package may be capable of stacking a greater number of semiconductor chips within the same volume by reducing a volume of a discrete semiconductor chip stacked in a semiconductor package Also, in the semiconductor package and the method of fabricating the same according to the embodiments, the number of stacked semiconductor chips may not be reduced; and the thickness of an interconnection substrate on which the plurality of semiconductor chips are stacked may be increased. As a result, the strength of the semiconductor package may be increased. For example, the semiconductor package may include an interconnection substrate having an increased thickness without reducing a number of stacked semiconductor chips.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A stacked semiconductor package, comprising:
   an interconnection substrate;
   a plurality of semiconductor chips, a set of the semiconductor chips being stacked such that an extension region of a top surface of each semiconductor chip of the set extends beyond an end of a semiconductor chip stacked thereon to form a plurality of extension regions;
   a plurality of adhesive layers between the interconnection substrate and a lowermost semiconductor chip of the plurality of semiconductor chips and between each of the plurality of semiconductor chips; and
   a plurality of protection layers on a top surface of an uppermost semiconductor chip of the plurality of semiconductor chips and on the extension regions.

2. The stacked semiconductor package as claimed in claim 1, wherein the plurality of protection layers are formed of a thermoset polymer, the thermoset polymer including a photosensitive component.

3. The stacked semiconductor package as claimed in claim 1, wherein:
   each of the semiconductor chips of the set includes a chip pad on the extension region thereof, and
   each of the plurality of protection layers includes a hole overlying the corresponding chip pad.

4. The stacked semiconductor package as claimed in claim 1, wherein the plurality of semiconductor chips are stacked in a step structure.

5. The stacked semiconductor package as claimed in claim 1, wherein the plurality of semiconductor chips are stacked in a zigzag structure.

6. The stacked semiconductor package as claimed in claim 1, wherein each of the plurality of semiconductor chips has a width different from others of the plurality of semiconductor chips.

7. The stacked semiconductor package as claimed in claim 1, wherein the plurality of protection layers includes:
   a plurality of first protection layers on the extension regions of the set of semiconductor chips, and
   a second protection layer on the top surface of the uppermost semiconductor chip of the plurality of semiconductor chips.

8. The stacked semiconductor package as claimed in claim 1, wherein:
   the plurality of adhesive layers are formed of a die attach film (DAF), and the plurality of protection layers are formed of photosensitive polyimide (PSPI).

9. The stacked semiconductor package as claimed in claim 1, wherein the extension region of the top surface of each semiconductor chip is exposed by a semiconductor chip stacked thereon.

10. The stacked semiconductor package as claimed in claim 2, wherein the thermoset polymer includes at least one of an epoxy, a polyimide, a novolak phenol, or a polynorbonene.

11. The stacked semiconductor package as claimed in claim 6, wherein each of the semiconductor chips under another of the semiconductor chips has a width greater than the other semiconductor chip thereon.

12. The stacked semiconductor package as claimed in claim 11, wherein the plurality of semiconductor chips are stacked in a pyramid structure.

13. The stacked semiconductor package as claimed in claim 7, further comprising:
   a substrate pad on a top surface of the interconnection substrate, the top surface of the interconnection substrate being beyond an end of the plurality of semiconductor chips; and
   chip pads on the plurality of semiconductor chips,
   wherein the substrate pad is electrically connected to the chip pads by bonding wires.

14. The stacked semiconductor package as claimed in claim 13, wherein the chip pads are on the extension regions.

15. The stacked semiconductor package as claimed in claim 14, wherein:
   the second protection layer includes a hole overlying the chip pad of the uppermost semiconductor chip of the plurality of semiconductor chips, and
   the plurality of first protection layers cover the chip pads on the extension regions.

16. The stacked semiconductor package as claimed in claim 15, wherein the plurality of first protection layers are formed of a different material from the second protection layer.

17. The stacked semiconductor package as claimed in claim 15, wherein the second protection layer includes a protection tape, and the protection tape is a UV tape.

18. A stacked semiconductor package comprising:
   an interconnection substrate;
   a plurality of semiconductor chips stacked on the interconnection substrate;
   a plurality of adhesive layers between the interconnection substrate and a lowermost semiconductor chip of the plurality of semiconductor chips and between each of the plurality of semiconductor chips; and
   a plurality of protection layers being disposed only on a region in which two semiconductor chips stacked adjacent to each other do not overlap.

19. The stacked semiconductor package as claimed in claim 18, wherein the plurality of adhesive layers includes:
   a first adhesive layer between the interconnection substrate and the lowermost semiconductor chip of the plurality of semiconductor chips; and
   a plurality of second adhesive layers between each of the plurality of semiconductor chips, wherein the first adhesive layer has a thickness thinner than a thickness of the plurality of second adhesive layers.

20. The stacked semiconductor package as claimed in claim 18, wherein the region in which two semiconductor chips stacked adjacent to each other do not overlap includes a chip pad.

\* \* \* \* \*